United States Patent
Muto et al.

(10) Patent No.: US 7,981,788 B2
(45) Date of Patent: Jul. 19, 2011

(54) SEMICONDUCTOR DEVICE AND A MANUFACTURING METHOD OF THE SAME

(75) Inventors: Nobuyasu Muto, Tokyo (JP); Naoki Kawanabe, Tokyo (JP); Hiroshi Ono, Tokyo (JP); Tamaki Wada, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 297 days.

(21) Appl. No.: 11/482,854

(22) Filed: Jul. 10, 2006

(65) Prior Publication Data
US 2007/0035002 A1  Feb. 15, 2007

(30) Foreign Application Priority Data

Jul. 11, 2005 (JP) ................................. 2005-201914

(51) Int. Cl.
*H01L 21/44* (2006.01)
(52) U.S. Cl. ................ 438/617; 438/109; 257/E21.509; 257/E21.705
(58) Field of Classification Search .......... 438/106–109, 438/612, 613, 617, FOR. 368, FOR. 365; 228/4.5, 180.5; 257/E21.509, E21.506, E21.598, 257/E21.705
See application file for complete search history.

(56) References Cited

U.S. PATENT DOCUMENTS

| | | | | |
|---|---|---|---|---|
| 5,424,917 A * | 6/1995 | Hiruta | ............................ | 361/699 |
| 5,818,848 A * | 10/1998 | Lin et al. | ......................... | 714/718 |
| 5,967,401 A * | 10/1999 | Nishiura et al. | ............ | 228/180.5 |
| 6,215,182 B1 * | 4/2001 | Ozawa et al. | .................. | 257/723 |
| 6,378,759 B1 * | 4/2002 | Ho et al. | ................... | 228/180.21 |
| 6,921,016 B2 | 7/2005 | Takahashi | | |
| 2001/0011766 A1 * | 8/2001 | Nishizawa et al. | ............ | 257/685 |
| 2002/0011650 A1 * | 1/2002 | Nishizawa et al. | ............ | 257/666 |
| 2003/0155405 A1 * | 8/2003 | Takahashi | ................... | 228/180.5 |
| 2003/0155660 A1 * | 8/2003 | Takahashi et al. | ............. | 257/777 |
| 2004/0041008 A1 * | 3/2004 | Mochida | ..................... | 228/180.5 |

FOREIGN PATENT DOCUMENTS

| | | |
|---|---|---|
| JP | 2003-243441 A | 8/2003 |
| JP | 2003-243442 A | 8/2003 |
| JP | 2004-207292 A | 7/2004 |

\* cited by examiner

*Primary Examiner* — Matthew Smith
*Assistant Examiner* — Quovaunda Jefferson
(74) *Attorney, Agent, or Firm* — Miles & Stockbridge P.C.

(57) ABSTRACT

The degree of freedom of the chip layout in a semiconductor device is improved, and improvement in packaging density is aimed at.

Since it becomes possible to form the wire of two directions on the pad of a memory chip by performing the over-bonding of reverse bonding by ball bonding, an effect equivalent to continuation stitch bonding of wedge bonding can be produced by ball bonding. Hereby, the degree of freedom of a chip layout and the degree of freedom of the lead layout of substrate 3 can be improved, and the packaging density on a substrate in a chip lamination type semiconductor device (memory card) can be improved.

19 Claims, 42 Drawing Sheets

FIG. 26
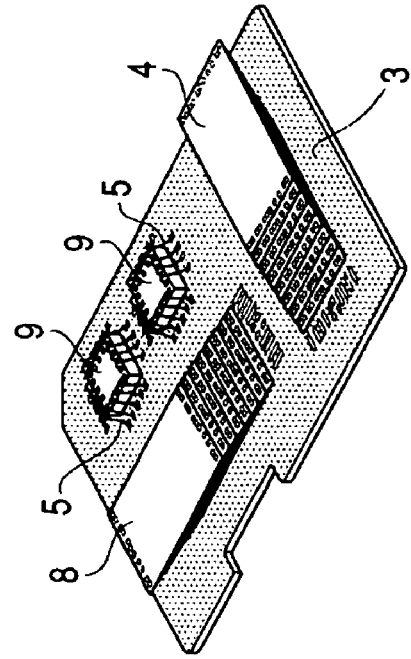
(A) INTERFACE CHIP-WIRE BONDING
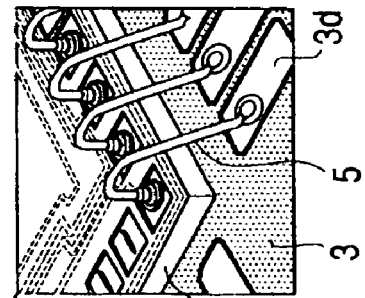
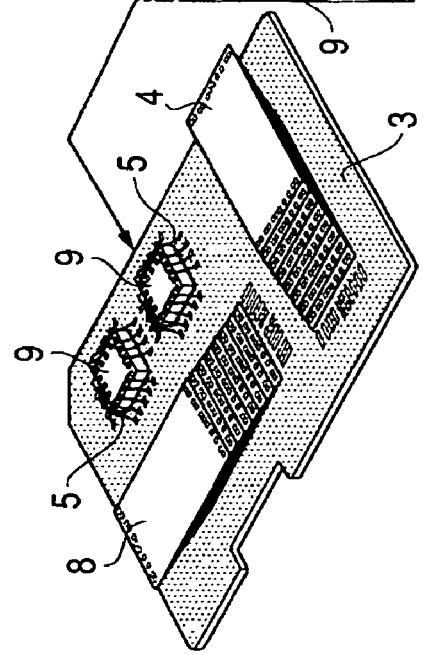
(B) MEMORY CHIP-WIRE BONDING

SEMICONDUCTOR DEVICE AND A MANUFACTURING METHOD OF THE SAME

CROSS-REFERENCE TO RELATED APPLICATION

The present application claims priority from Japanese patent application No. 2005-201914 filed on Jul. 11, 2005, the content of which is hereby incorporated by reference into this application.

FIELD OF THE INVENTION

The present invention relates to a semiconductor device and its manufacturing technology, and particularly relates to an effective technology in the application to a semiconductor memory card (it is only henceforth called a memory card).

DESCRIPTION OF THE BACKGROUND ART

In the manufacturing method of a semiconductor device, the point of the second wire and a tool perform bonding, without crushing the portion which has not been crushed by bonding of the first wire (for example, refer to Patent Reference 1).

Furthermore, in the manufacturing method of a semiconductor device, bonding of a part of a wire is made to the center of the drawing direction of the wire, or the portion beyond it in a bump (for example, refer to Patent Reference 2).

A wire bonding method includes making bonding of the point of a wire to the first region, forming the curved part of the wire above the second region while pulling out the wire to the direction of the second region from the first region, forming the lump part of the wire by making melting of the curved part, and making bonding of the lump part to the second region (for example, refer to Patent Reference 3).

[Patent Reference 1] Japanese Unexamined Patent Publication No. 2003-243442 (FIG. 15)
[Patent Reference 2] Japanese Unexamined Patent Publication No. 2003-243441 (FIG. 9)
[Patent Reference 3] Japanese Unexamined Patent Publication No. 2004-207292 (FIG. 2)

SUMMARY OF THE INVENTION

Memory cards, such as SD (Secure Digital) card, are one of the memory devices which memorizes information in the semiconductor memory chip of the inside. In this memory card, since information is directly and electrically accessed to the nonvolatile memory formed in the semiconductor memory chip, exchange of the storage medium is possible as well as the time of writing and reading-out being quick compared with another memory devices by a part without control of a mechanical system.

Since a configuration is comparatively small and light, it is mainly used as an auxiliary storage device of instruments to which portability is demanded, such as a portable personal computer, a cellular phone, or a digital camera.

Therefore, in the memory card, in order to increase memory capacity and to reduce mounting area, the thing of the structure which laminates and arranges the semiconductor memory chips in many stages on a substrate in the inside is developed.

The electric connection with a substrate of the semiconductor chip laminated by many stages is mainly made by wire bonding, and various methods can be considered as shown in each comparative example of FIG. 42, FIG. 43, FIG. 45, and FIG. 46.

For example, as for the method shown in the comparative example of FIG. 42, as shown in the section A, both semiconductor chip 100 of the first stage and semiconductor chip 200 of the second stage are electrically connected with the common electrode (lead 3d) of substrate 3 by forward bonding (first bonding is performed to the electrode of a chip and second bonding is performed to the terminal of a substrate).

As for the method shown in the comparative example of FIG. 43, as shown in the section A, both semiconductor chip 100 of the first stage and semiconductor chip 200 of the second stage are electrically connected with the common electrode (lead 3d) of substrate 3 by reverse bonding (first bonding is performed to the electrode of a substrate and second bonding is performed to the terminal of a chip).

By the method shown in FIG. 42 and FIG. 43, a common problem as shown in the comparative example of FIG. 44 arises. That is, as shown in the section A and the section B of FIG. 44, when the area of the electrode (lead 3d) of substrate 3 is small, that bonding cannot be carried out in the two directions from one electrode will pose a problem. That second bonding cannot be performed from one electrode poses a problem.

As shown in the section C of FIG. 44, when semiconductor chips 100 and 200 are thin, the interval between up and down wires becomes narrow, and the problem that wires contact arises. For example, when the interval between up and down wires is about 15□m, the wires which adjoined each other contact by wire deformation at the time of a resin molding, and the problem that the reliability of a product falls occurs. It is a problem that the wiring design to the electrode (lead 3d) of substrate 3 becomes complicated.

By the method shown in FIG. 42, the height of the wire loop on a chip cannot be suppressed low. For example, in the memory card which laminated four or more stages of chips, at forward bonding, the height of a wire loop is not settled in the height of a memory card, but the problem that it cannot be mounted occurs.

As for the method shown in the comparative example of FIG. 45, as shown in the section A, stitch bonding is made to connect continuously from an electrode of semiconductor chip 200 of the second stage to the electrode of semiconductor chip 100 of the first stag, and further to the lead 3d of substrate 3. In the case, when performing wire bonding to lead 3d of substrate 3 continuously after performing wire bonding to the electrode of semiconductor chip 100 of the first stage, capillary 15 performs reverse operation on the electrode of semiconductor chip 100 of the first stage. Namely, as shown in operation of capillary 15 of the comparative example of FIG. 47-FIG. 51, when performing forward bonding, capillary 15 once stands up to the direction contrary to the direction which performs wiring (reverse operation), and it moves in the wiring direction.

Therefore, when it stands up in the reverse direction in reverse operation, the problem that wire 20 connected from semiconductor chip 200 of the second stage to semiconductor chip 100 of the first stage and capillary 15 which performed reverse operation contact happens.

When it is going to solve this problem, distance L shown in FIG. 45 must be secured to be long, and the problem that the mounting area needed for chip lamination is not made small will arise.

Since stitch bonding shown in FIG. 45 is wedge bonding, the problem that small pad correspondence of the pad which is an electrode of semiconductor chips 100 and 200 cannot be performed arises. Continuation stitch bonding is formed almost linearly and has the problem that it cannot wire in the two directions.

The method shown in the comparative example of FIG. 46 makes a rectangle a part of a plurality of electrodes of semiconductor chip 100 of the first stage. In the section A, upper wire 20 is connected by reverse bonding, and lower wire 20 is connected by forward bonding. In the section B, upper wire 20 is connected by forward bonding, and lower wire 20 is connected by reverse bonding. At the section C, both wires 20 of the upside and the bottom are connected by reverse bonding. The section D shows that connecting upper wire 20 by reverse bonding, and connecting lower wire 20 by forward bonding to the pad which is lengthwise to the wiring direction is difficult on the operation of capillary 15.

By the method shown in the comparative example of FIG. 46, a rectangular pad is required, and since it becomes the correspondence from a chip design time, it is a problem that the versatility of semiconductor chips 100 and 200 falls. Except a rectangular pad, it is a problem that bonding cannot be carried out in the two directions.

Although there is a description of performing reverse bonding and stitch bonding, to the laminated chips in each of the Patent Reference 1 (Japanese Unexamined Patent Publication No. 2003-243442), Patent Reference 2 (Japanese Unexamined Patent Publication No. 2003-243441), and Patent Reference 3 (Japanese Unexamined Patent Publication No. 2004-207292), there is no description that the laminated chips are the chips of the same kind.

A purpose of the present invention is to offer the technology in which the degree of freedom of a chip layout can be improved and improvement in packaging density can be aimed at.

Another purpose of the present invention is to offer the technology in which reduction of cost can be aimed at.

The above-described and the other purposes and novel features of the present invention will become apparent from the description herein and accompanying drawings.

Of the inventions disclosed in the present application, typical ones will next be summarized briefly.

Namely, as for the present invention, the point of ball state of the first wire is connected to the first electrode, a part of the first wire is connected to the second electrode of a location higher than the first electrode, the point of ball state of the second wire is connected to the first wire on the second electrode, a part of the second wire is connected to the third electrode of a location higher than the second electrode, and the semiconductor chips to which the first and the second wires are connected are the same kinds.

As for the present invention, the locations of the first electrode, and the second electrode of a location higher than this are asked for by recognizing the first mark and the second mark, the point of ball state of the first wire is connected to the first electrode, a part of the first wire is connected to the second electrode, the location of the third electrode of a location higher than the second electrode is asked for by recognizing the third mark, the point of ball state of the second wire is connected to the first wire on the second electrode, and a part of the second wire is connected to the third electrode.

As for the present invention, further, the first and the second memory chips, a chip for control, an interface chip, a substrate on which respective chips are mounted, and a plurality of external terminals are included, regarding the first and the second memory chips, one of them is mounted in a vertical direction, and the other of them is mounted in the horizontal direction on the front surface of the substrate, respectively, regarding the interface chip, two are mounted on the surface of the substrate, the chip for control is mounted on the back surface of the substrate, and the external terminals are formed on the back surface of the substrate.

Advantages achieved by some of the most typical aspects of the invention disclosed in the present application will be briefly described below.

The degree of freedom of a chip layout and the degree of freedom of the terminal layout of a substrate can be improved, and the packaging density on the substrate in a chip lamination type semiconductor device can be improved.

A wire can be shortened, and reduction of the cost of a chip lamination type semiconductor device can be aimed at, reducing the cost concerning a wire.

BRIEF DESCRIPTION OF THE DRAWINGS

FIGS. 26A and 26B are perspective views showing an example of the wire bonding method of the assembly of the semiconductor device shown in FIG. 1;

DETAILED DESCRIPTION OF THE PREFERRED EMBODIMENTS

Figure 1:
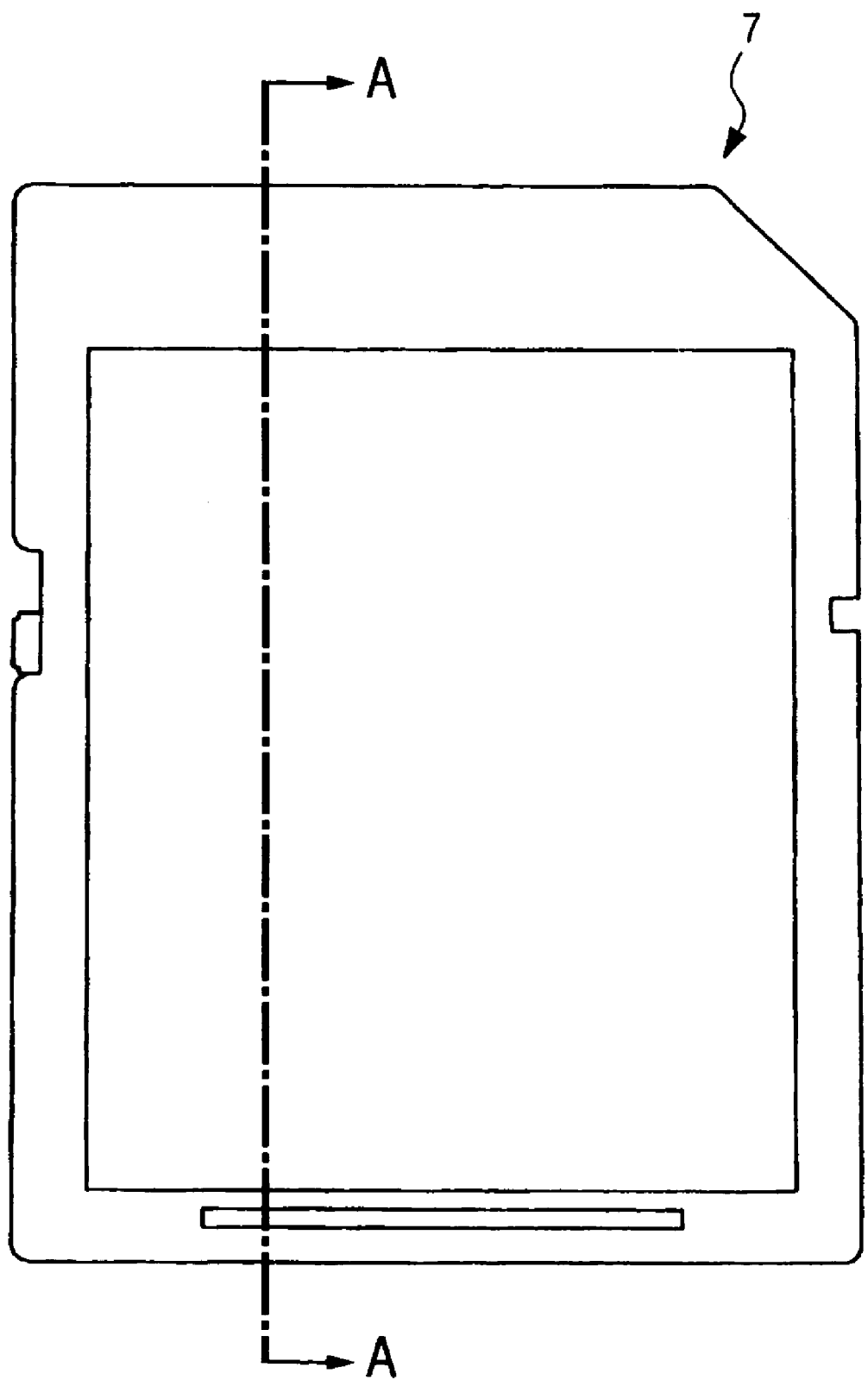
FIG. 1 is a plan view showing an example of the structure of the front surface side of the semiconductor device of Embodiment 1 of the present invention.

In the following embodiments, except the time when especially required, explanation of identical or similar part is not repeated in principle.

Further, in the below-described embodiments, a description will be made after divided into plural sections or in plural embodiments if necessary for convenience sake. These plural sections or embodiments are not independent each other, but in relation such that one is a modification example, details or complementary description of a part or whole of the other one unless otherwise specifically indicated.

In the below-described embodiments, when a reference is made to the number of elements (including the number, value, amount and range), the number is not limited to a specific number but may be equal to or greater than or less than the specific number, unless otherwise specifically indicated or principally apparent that the number is limited to the specific number.

Hereafter, embodiments of the invention are explained in detail based on drawings.

In all the drawings for describing the embodiments, members of a like function will be identified by like reference numerals and overlapping descriptions will be omitted.

Embodiment 1

Figure 2:
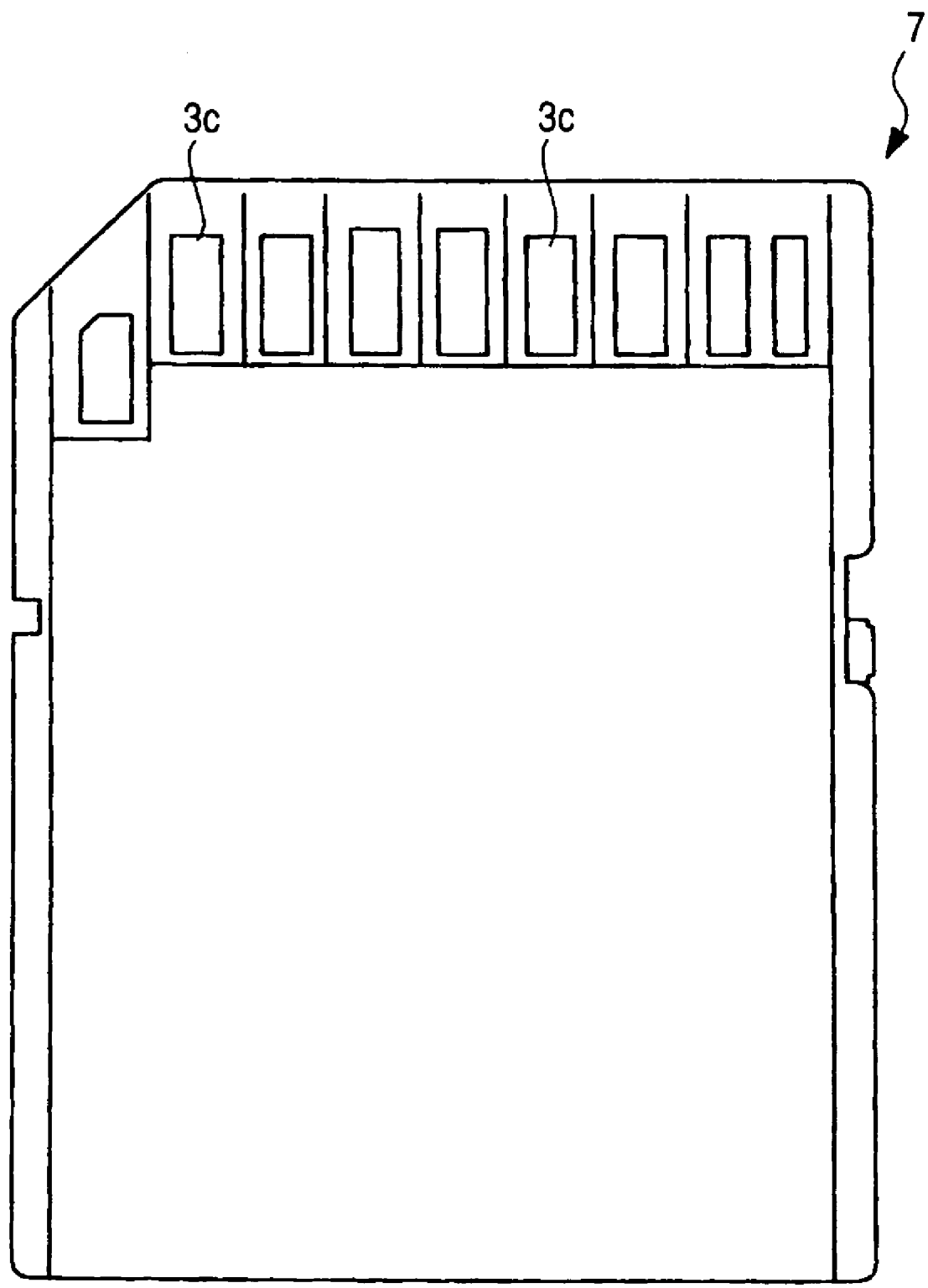
FIG. 2 is a back view showing an example of the structure of the back surface side of the semiconductor device shown in FIG. 1.
Figure 3:
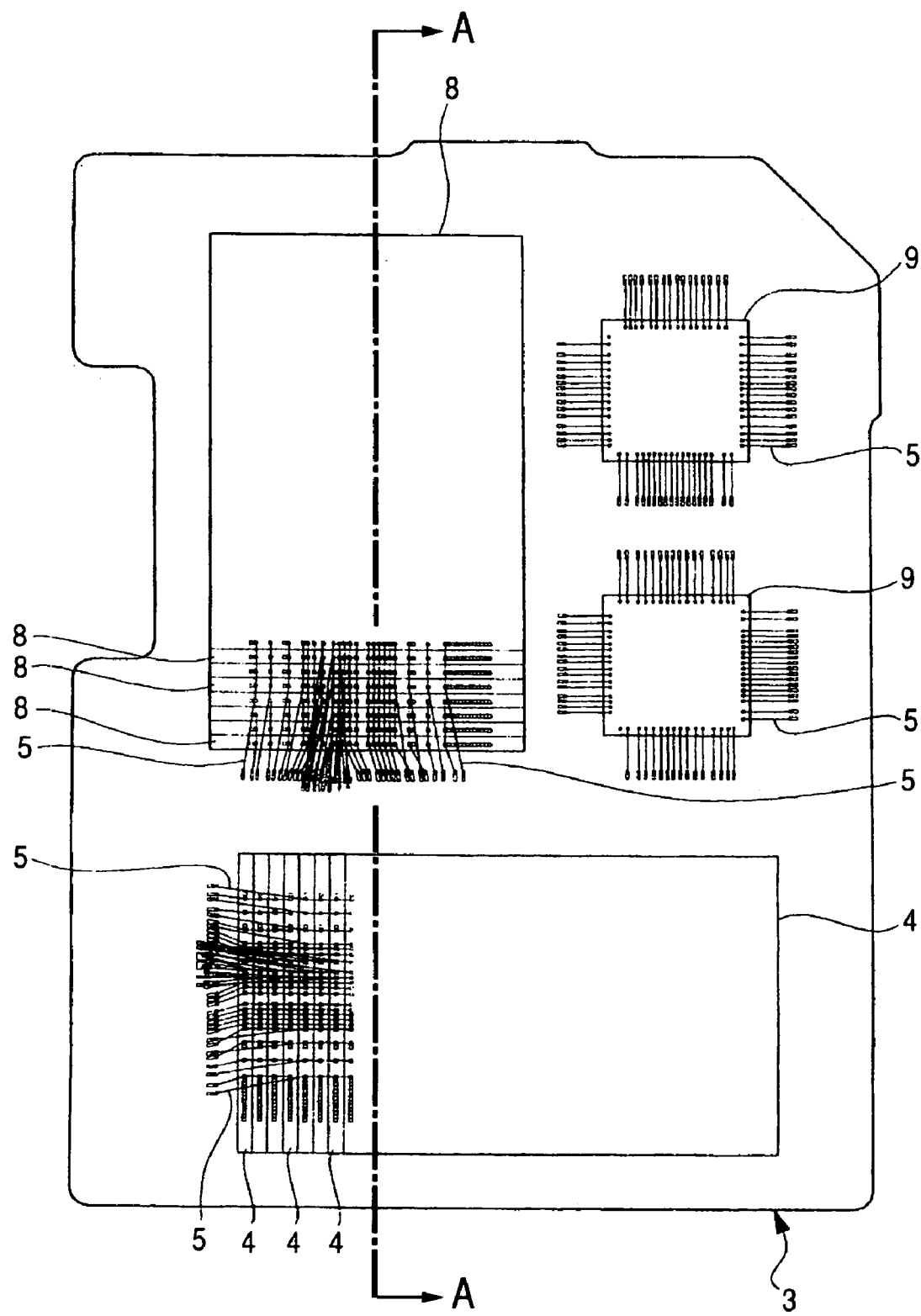
FIG. 3 is a plan view showing an example of the component mounting layout of the front surface side of the substrate in the semiconductor device shown in FIG. 1.
Figure 4:
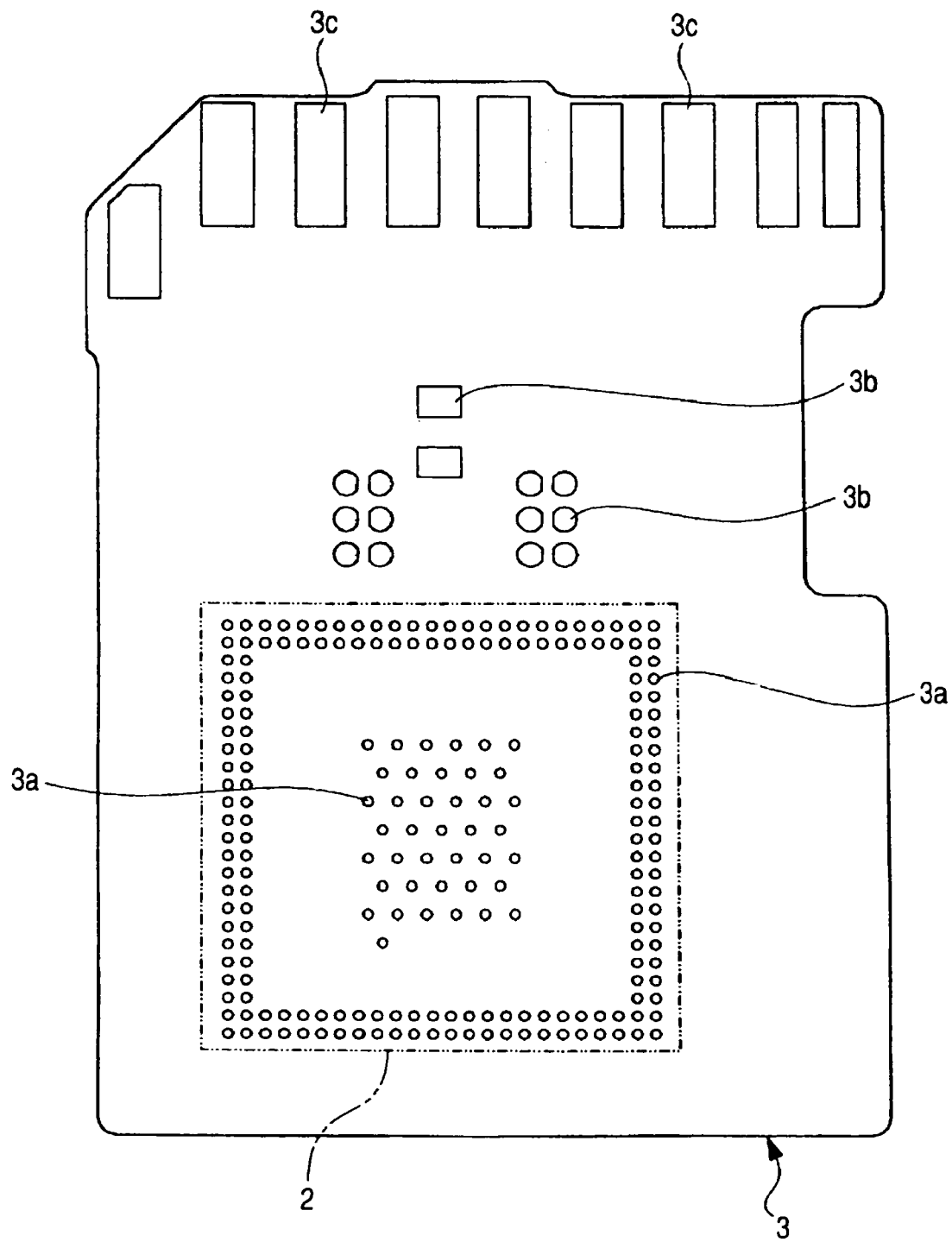
FIG. 4 is a back view showing an example of the component mounting layout of the back surface side of the substrate in the semiconductor device shown in FIG. 1.
Figure 5:
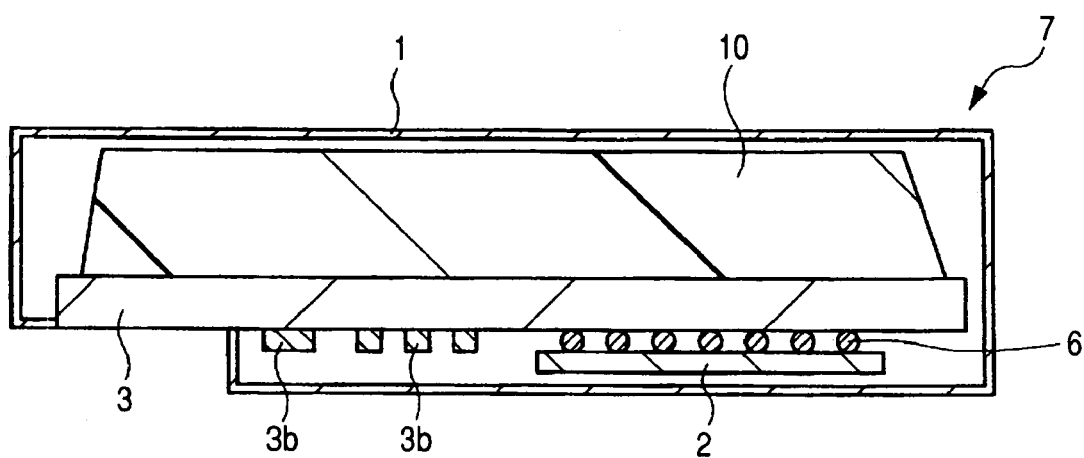
FIG. 5 is a cross-sectional view showing the structure of the cross section cut along the A-A line shown in FIG. 1.
Figure 6:
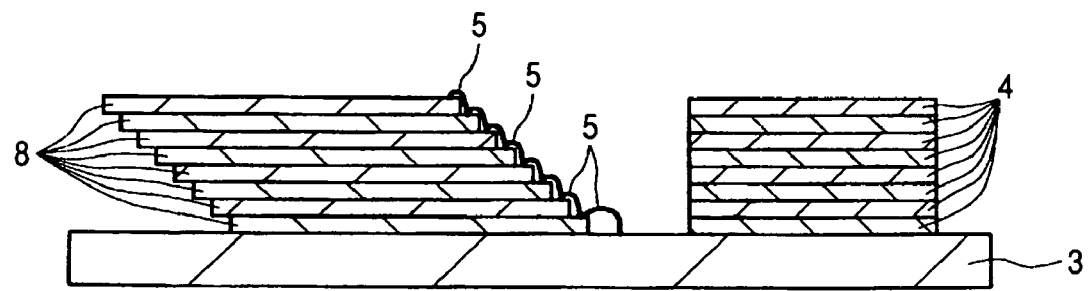
FIG. 6 is a cross-sectional view showing the structure of the cross section cut along the A-A line shown in FIG. 3.
Figure 7:
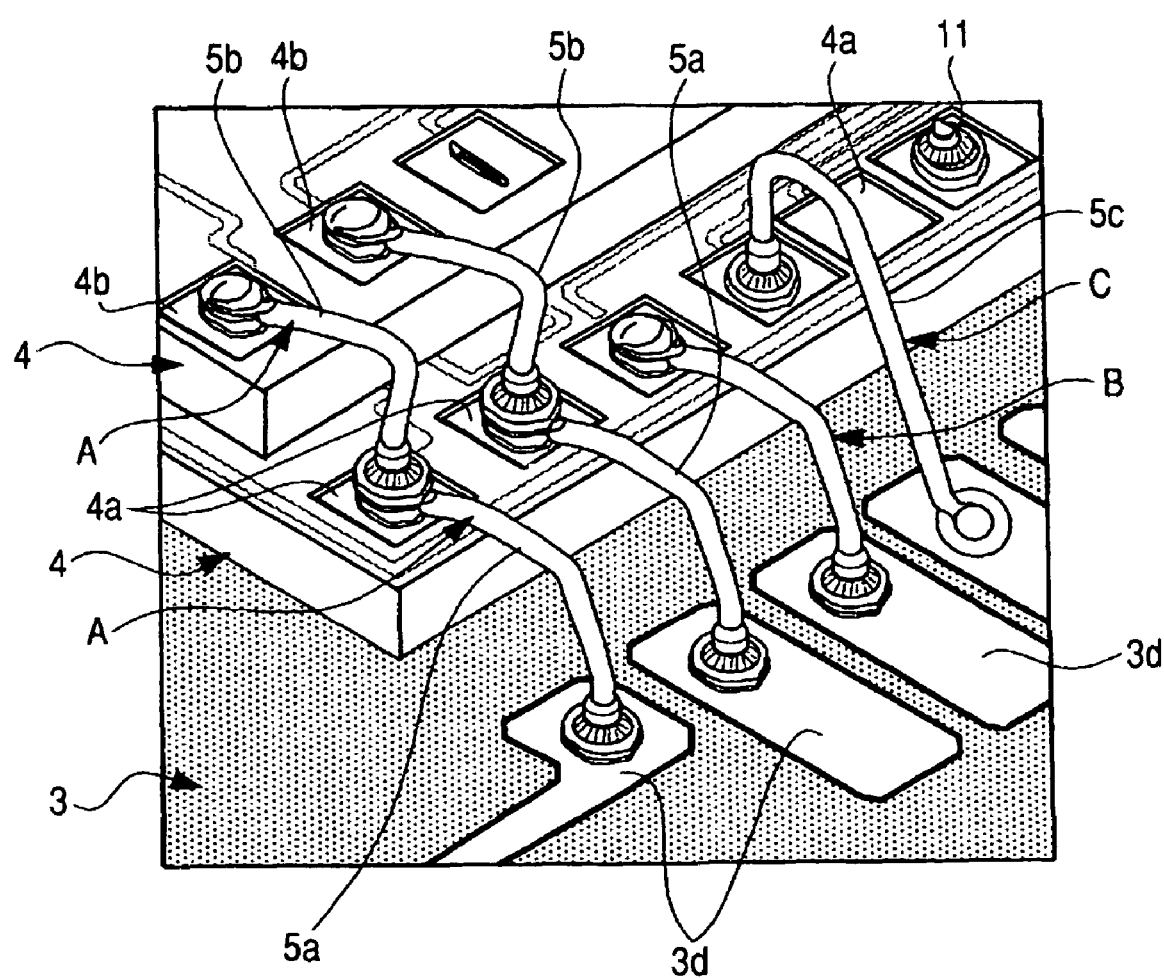
FIG. 7 is a fragmentary perspective view showing an example of the kind of wire bonding in the semiconductor device shown in FIG. 1.

FIG. 1 is a plan view showing an example of the structure of the front surface side of the semiconductor device of Embodiment 1 of the present invention, FIG. 2 is a back view showing an example of the structure of the back surface side of the semiconductor device shown in FIG. 1, FIG. 3 is a plan view showing an example of the component mounting layout of the front surface side of the substrate in the semiconductor device shown in FIG. 1, FIG. 4 is a back view showing an example of the component mounting layout of the back surface side of the substrate in the semiconductor device shown in FIG. 1, and FIG. 5 is a cross-sectional view showing the structure of the cross section cut along the A-A line shown in FIG. 1. FIG. 6 is a cross-sectional view showing the structure of the cross section cut along the A-A line shown in FIG. 3, FIG. 7 is a fragmentary perspective view showing an example of the kind of wire bonding in the semiconductor device shown in FIG. 1, FIGS. 8 to 10 are partially sectional views showing an example of the wire bonding shown in FIG. 7, respectively, and FIG. 11 is a fragmentary perspective view showing an example of the kind of wire bonding in the semiconductor device shown in FIG. 1.

Figure 12:
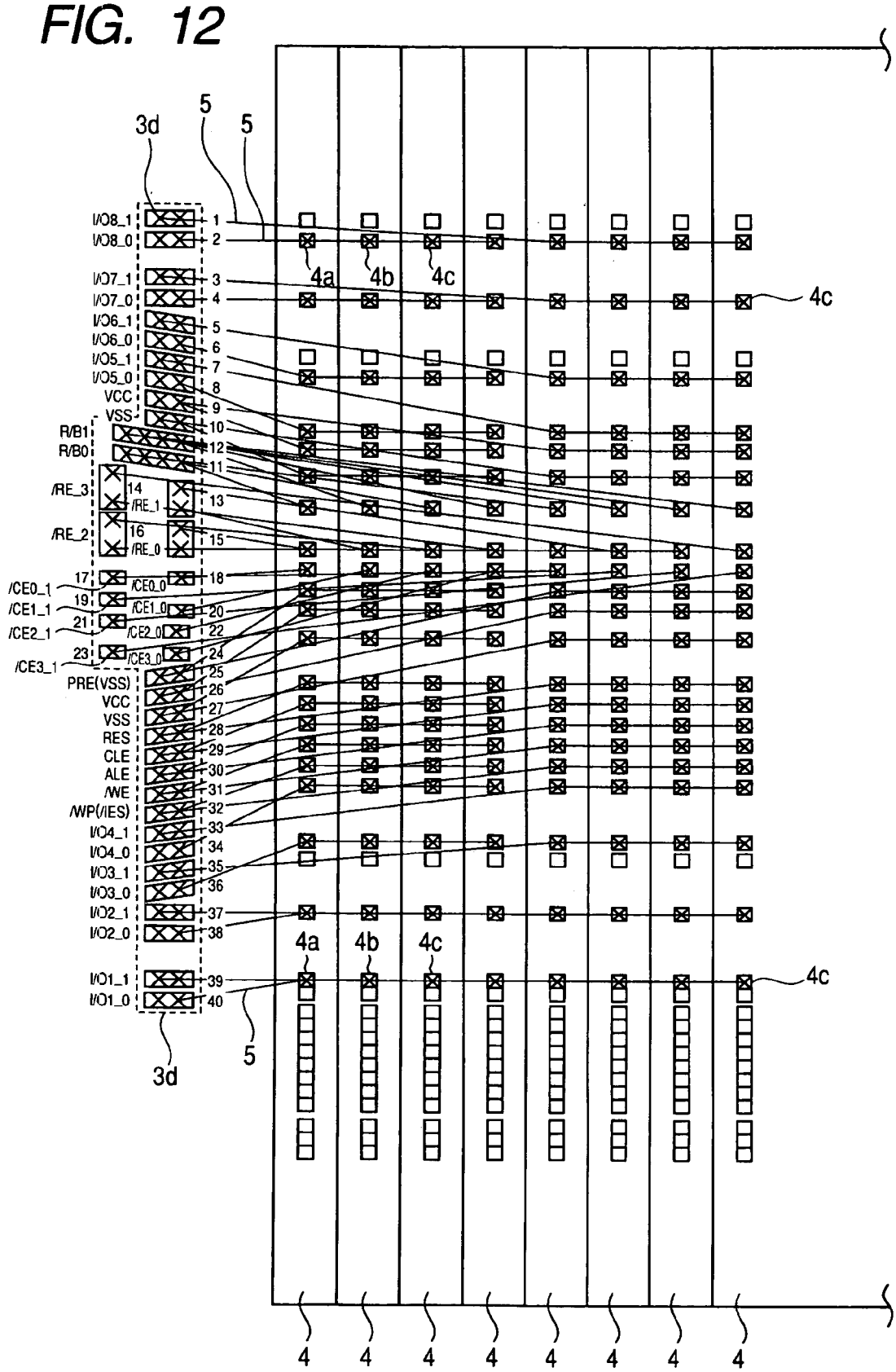
FIG. 12 is a plan view showing an example of a wiring state for eight stages in the memory chip mounted in the semiconductor device shown in FIG. 1.
Figure 13:
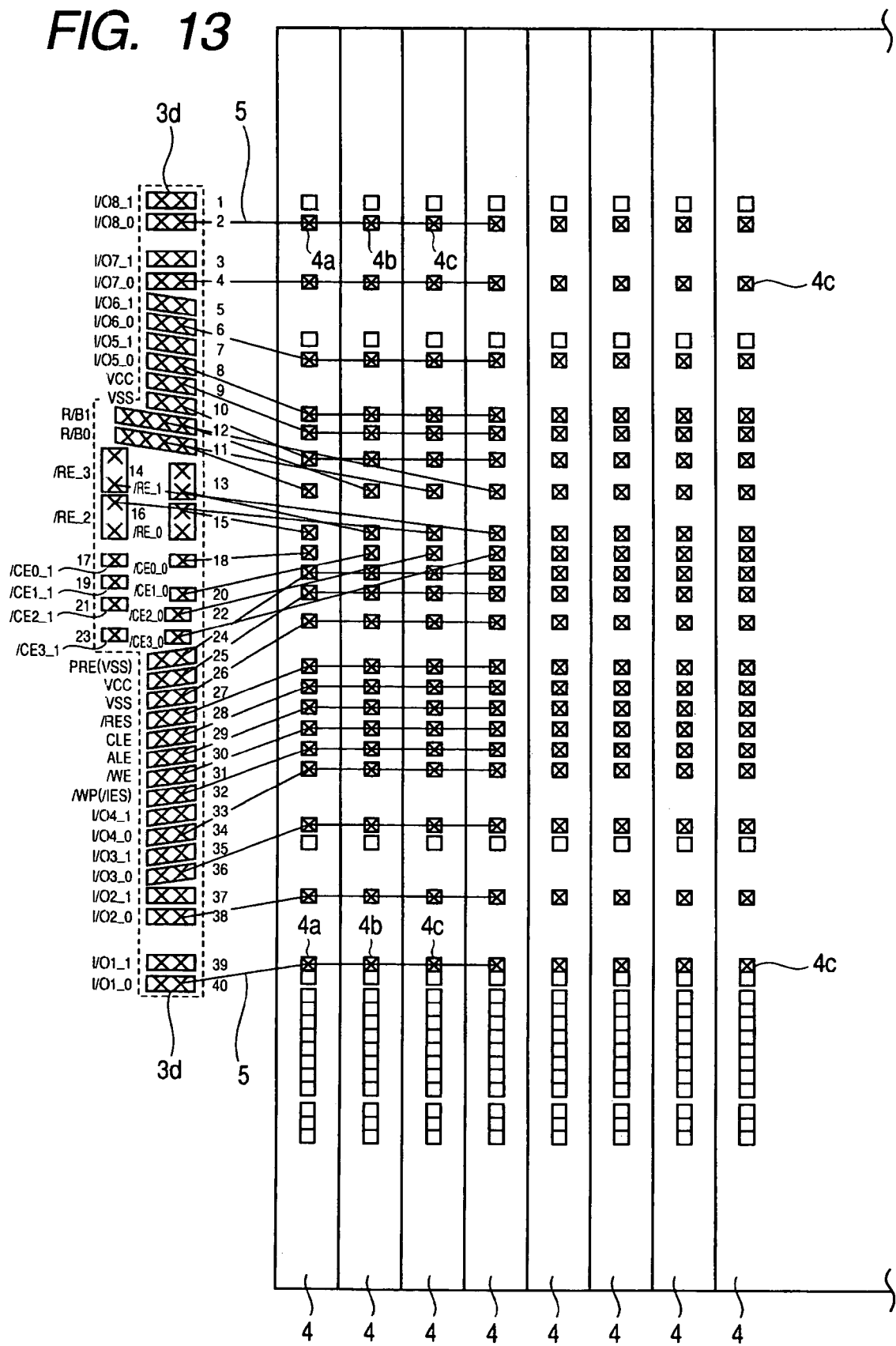
FIG. 13 is a plan view showing an example of a wiring state for four stages in the memory chip mounted in the semiconductor device shown in FIG. 1.
Figure 14:
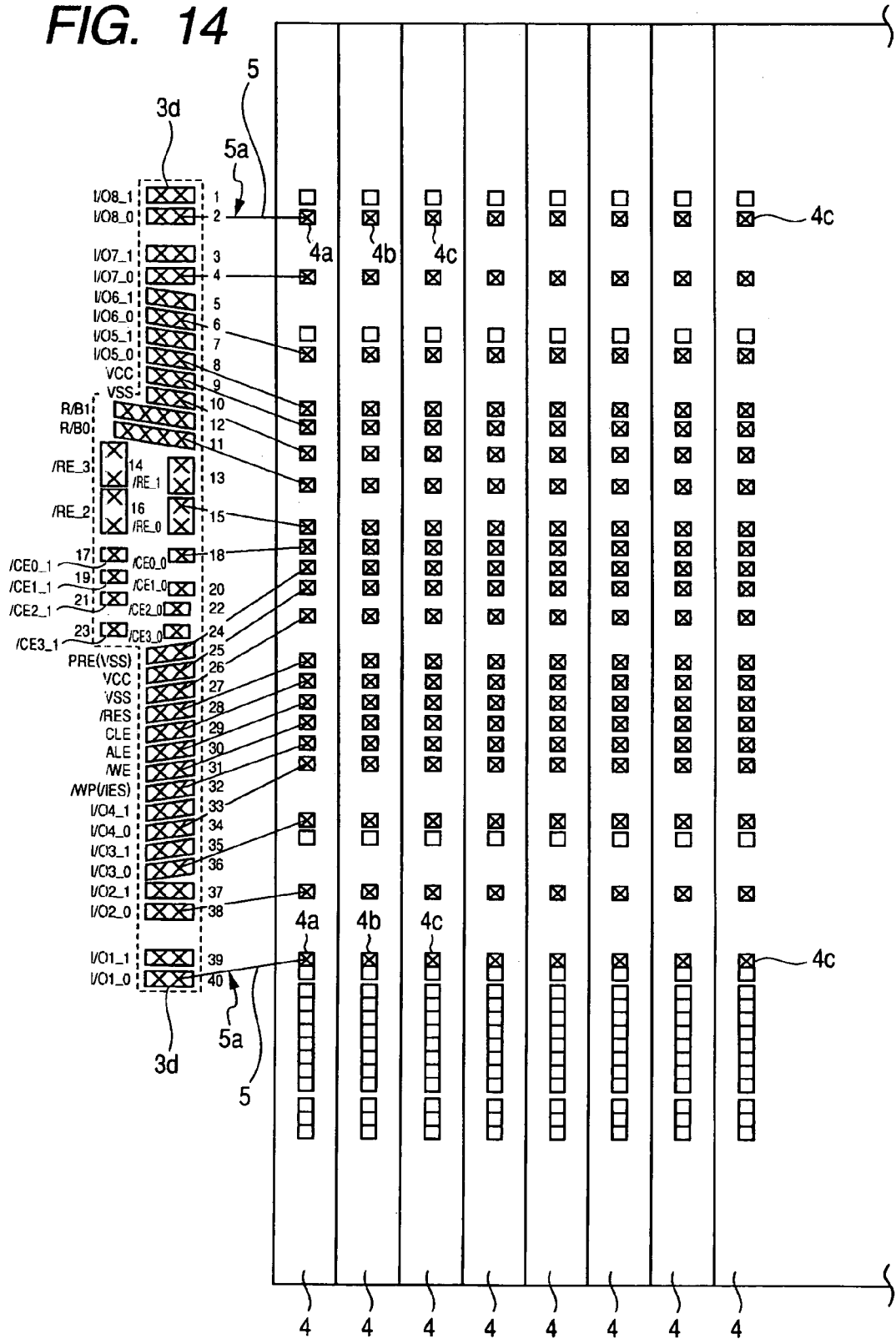
FIG. 14 is a plan view showing an example of a wiring state of the memory chip of the first stage mounted in the semiconductor device shown in FIG. 1.
Figure 15:
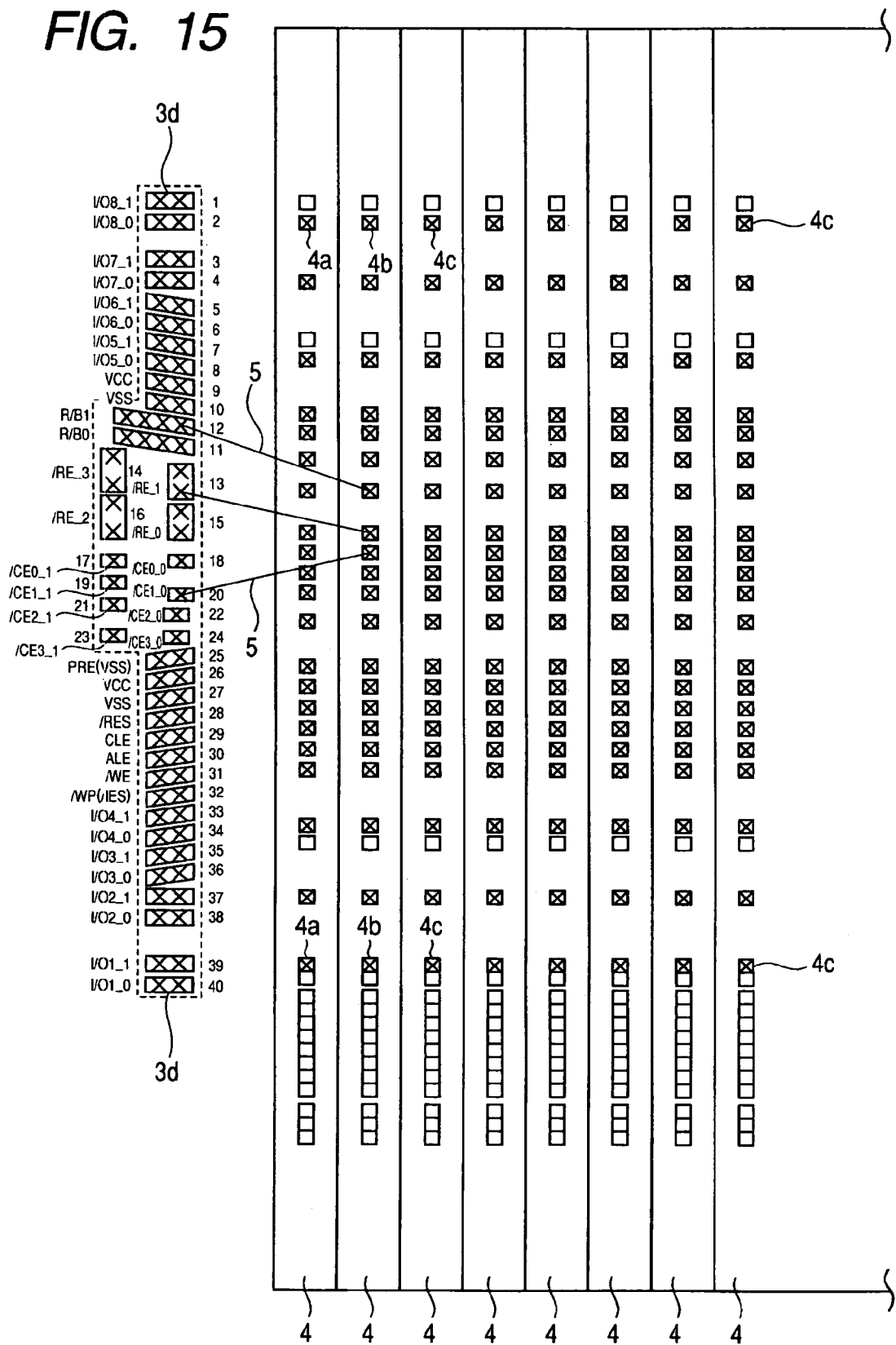
FIG. 15 is a plan view showing an example of a wiring state of the memory chip of the second stage mounted in the semiconductor device shown in FIG. 1.
Figure 16:
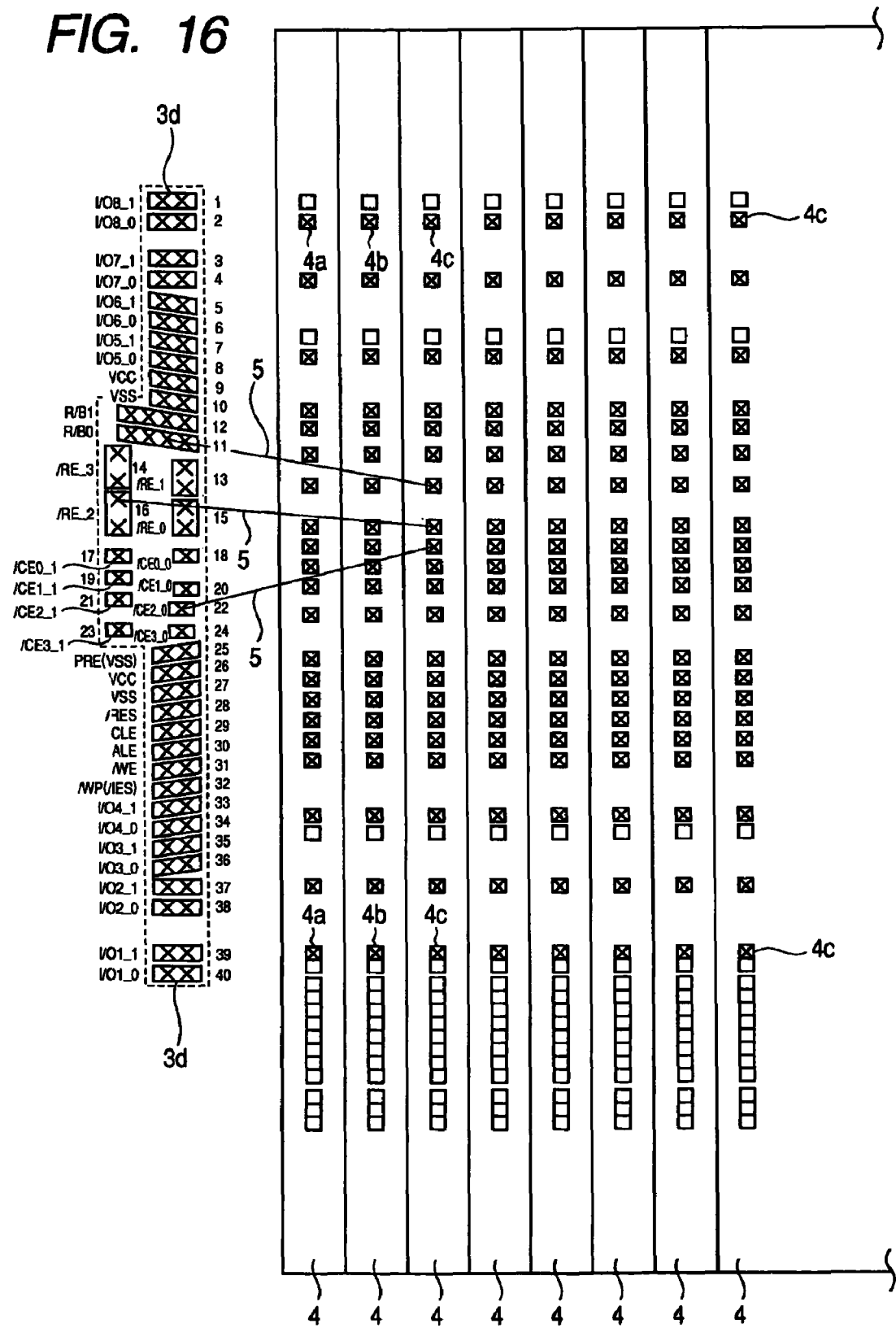
FIG. 16 is a plan view showing an example of a wiring state of the memory chip of the third stage mounted in the semiconductor device shown in FIG. 1.
Figure 17:
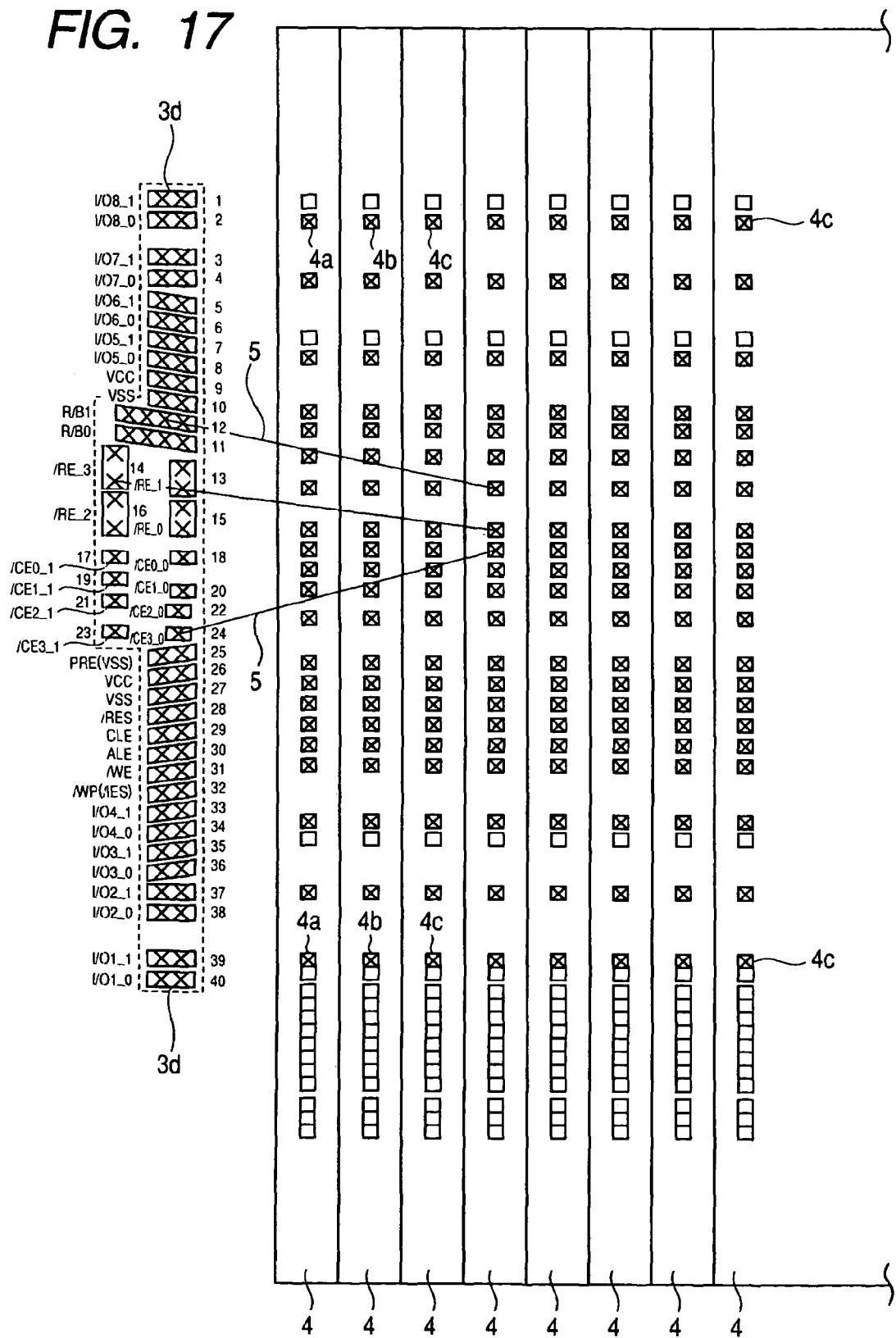
FIG. 17 is a plan view showing an example of a wiring state of the memory chip of the fourth stage mounted in the semiconductor device shown in FIG. 1.
Figure 18:
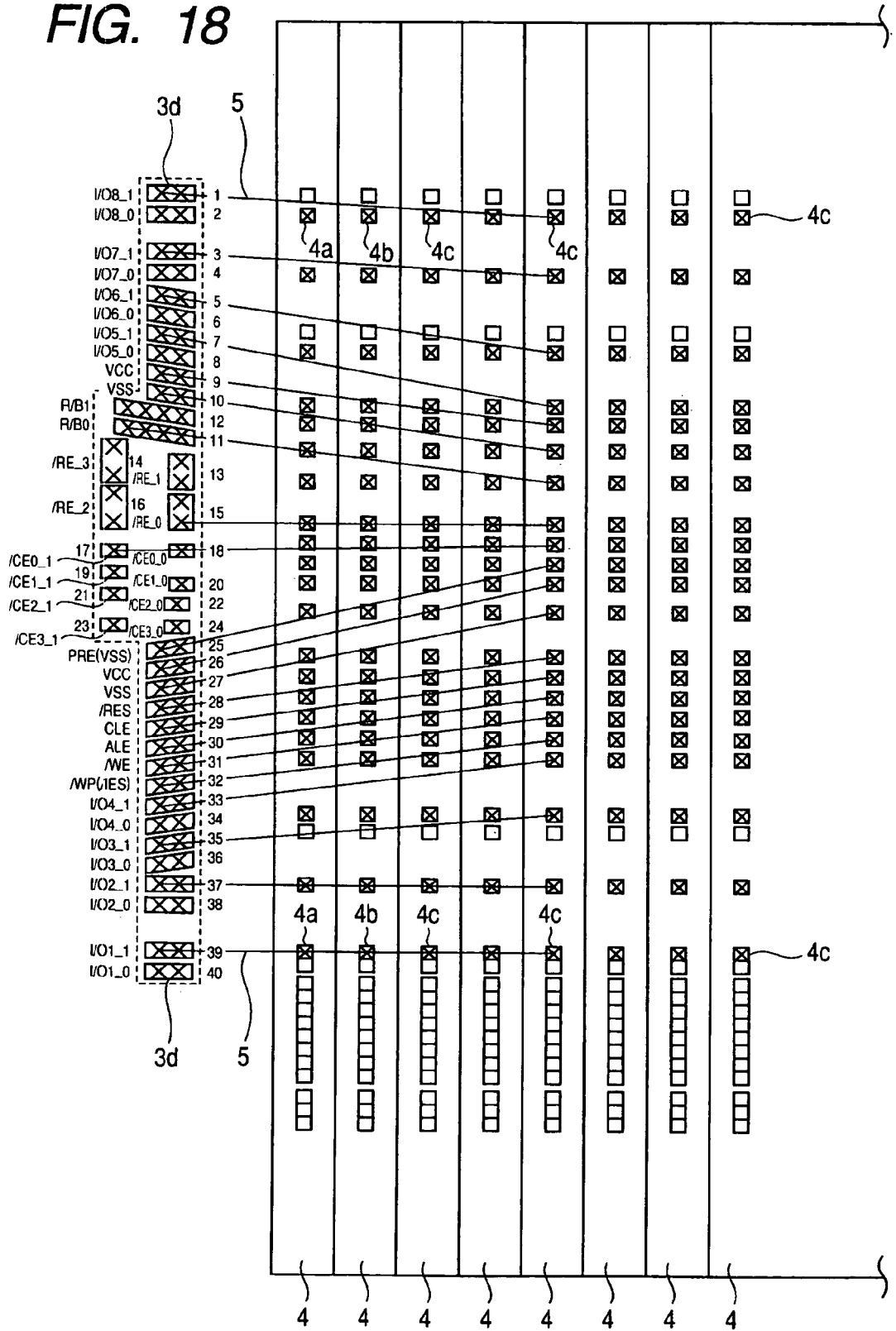
FIG. 18 is a plan view showing an example of a wiring state of the memory chip of the fifth stage mounted in the semiconductor device shown in FIG. 1.
Figure 19:
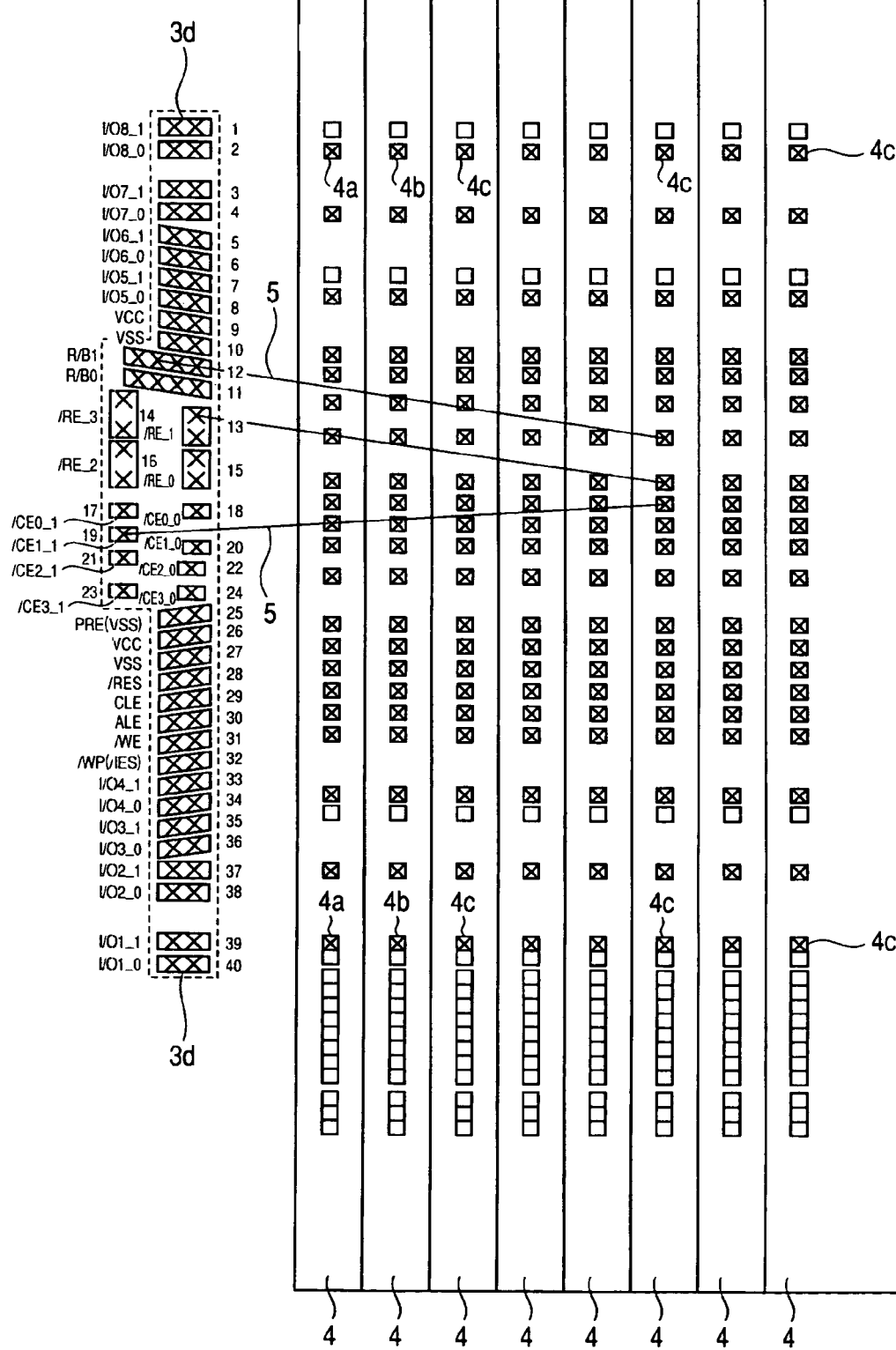
FIG. 19 is a plan view showing an example of a wiring state of the memory chip of the sixth stage mounted in the semiconductor device shown in FIG. 1.
Figure 20:
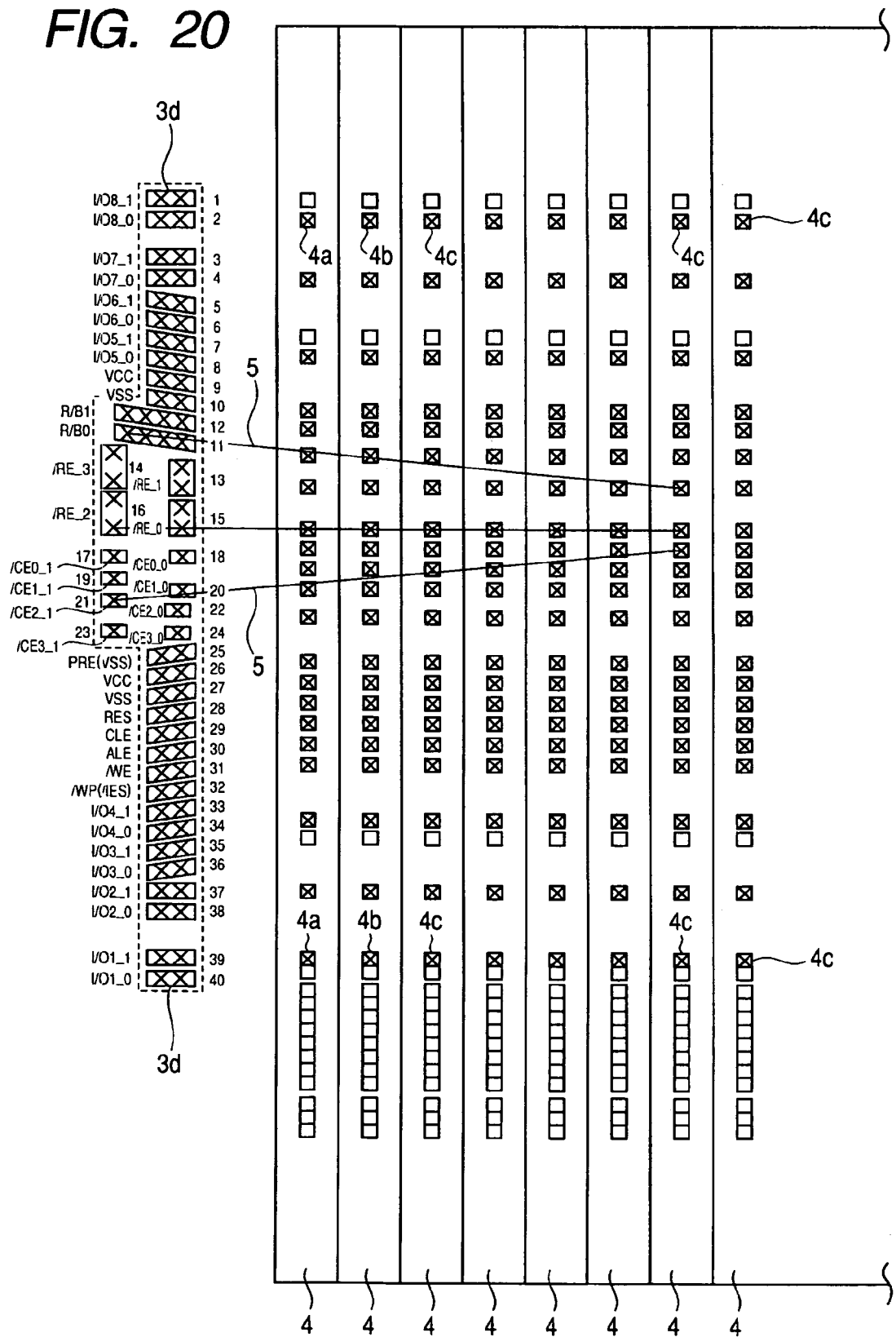
FIG. 20 is a plan view showing an example of a wiring state of the memory chip of the seventh stage mounted in the semiconductor device shown in FIG. 1.
Figure 21:
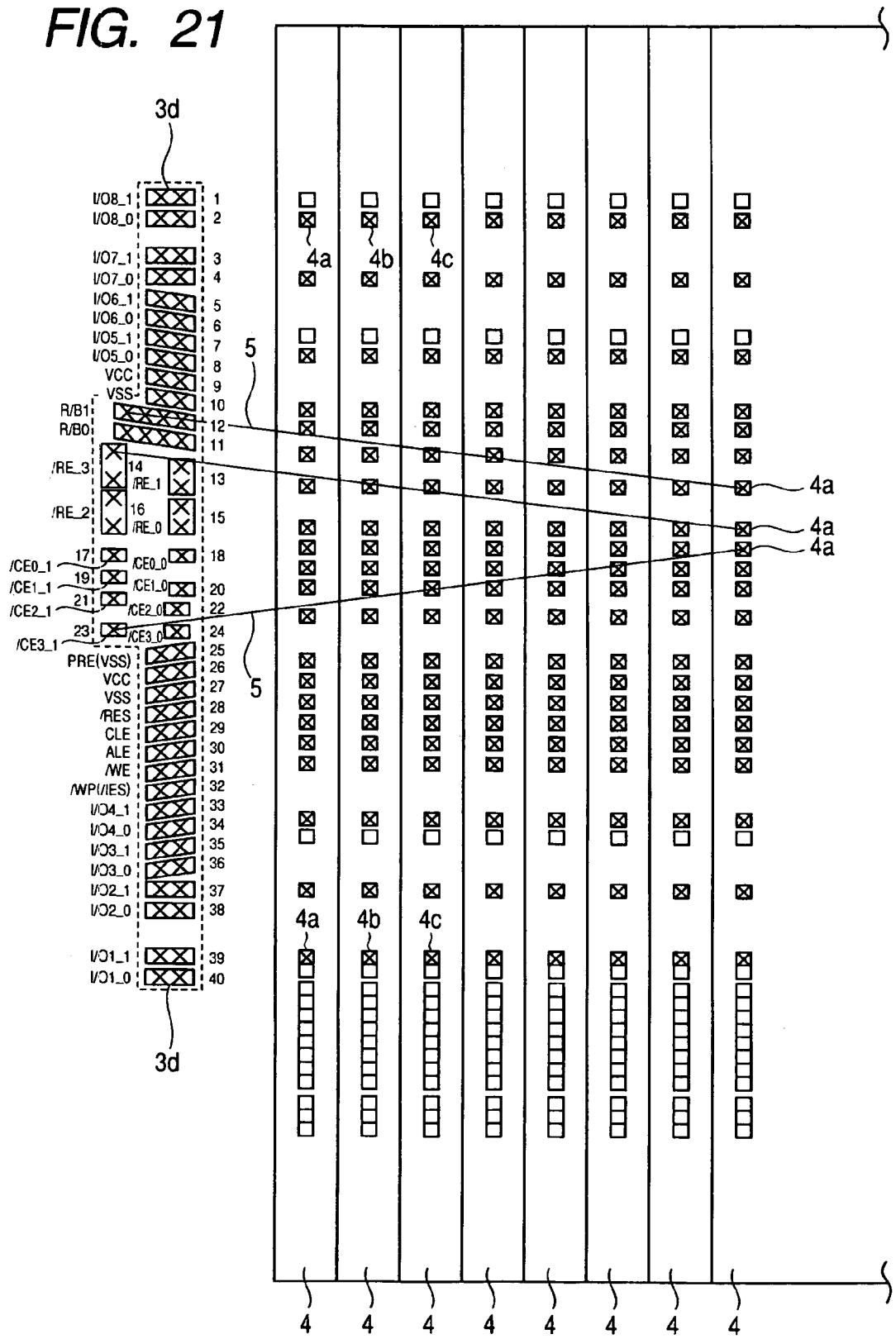
FIG. 21 is a plan view showing an example of a wiring state of the memory chip of the eighth stage mounted in the semiconductor device shown in FIG. 1.

FIG. 12 is a plan view showing an example of a wiring state for eight stages in the memory chip mounted in the semiconductor device shown in FIG. 1, FIG. 13 is a plan view showing an example of a wiring state for four stages in the memory chip, FIG. 14 is a plan view showing an example of a wiring state of the memory chip of the first stage, FIG. 15 is a plan view showing an example of a wiring state of the memory chip of the second stage, and FIG. 16 is a plan view showing an example of a wiring state of the memory chip of the third stage. FIG. 17 is a plan view showing an example of a wiring state of the memory chip of the fourth stage, FIG. 18 is a plan view showing an example of a wiring state of the memory chip of the fifth stage, FIG. 19 is a plan view showing an example of a wiring state of the memory chip of the sixth stage, FIG. 20 is a plan view showing an example of a wiring state of the memory chip of the seventh stage mounted in the semiconductor device shown in FIG. 1, and FIG. 21 is a plan view showing an example of a wiring state of the memory chip of the eighth stage.

Figure 22:
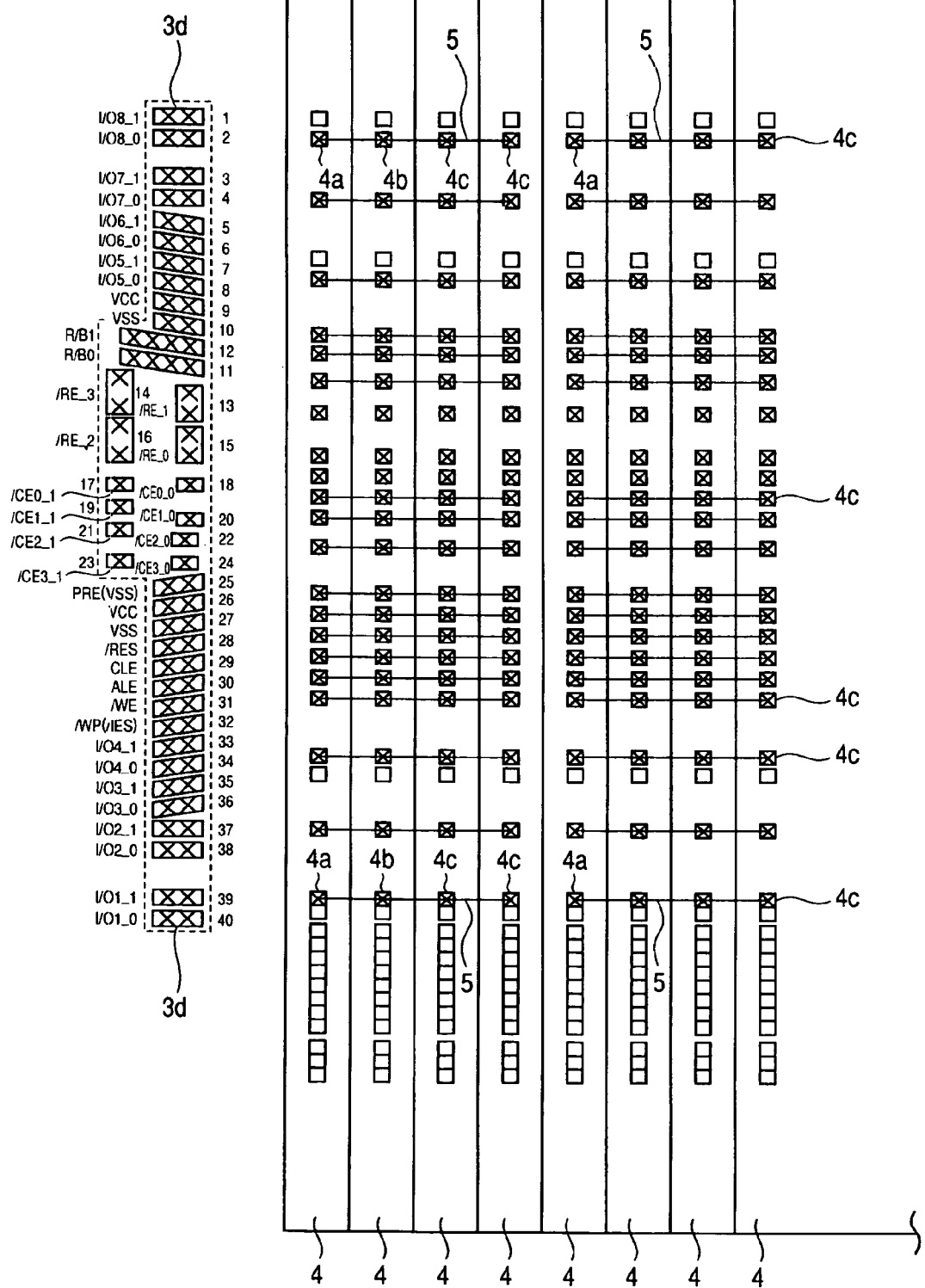
FIG. 22 is a plan view showing only stitch bonding in the wiring for eight stages of a memory chip mounted in the semiconductor device shown in FIG. 1.
Figure 23:
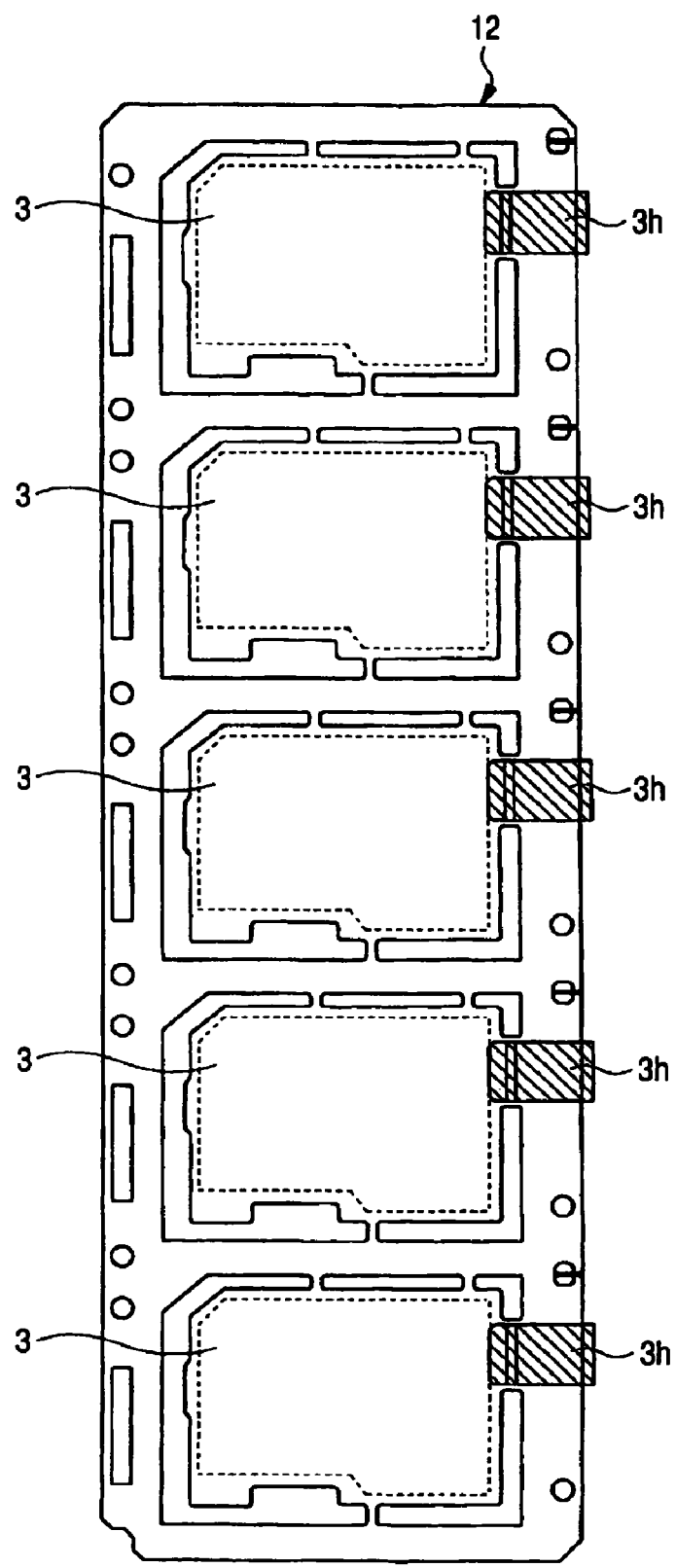
FIG. 23 is a plan view showing an example of the structure of the multi-card substrate used for the assembly of the semiconductor device shown in FIG. 1.
Figure 24:
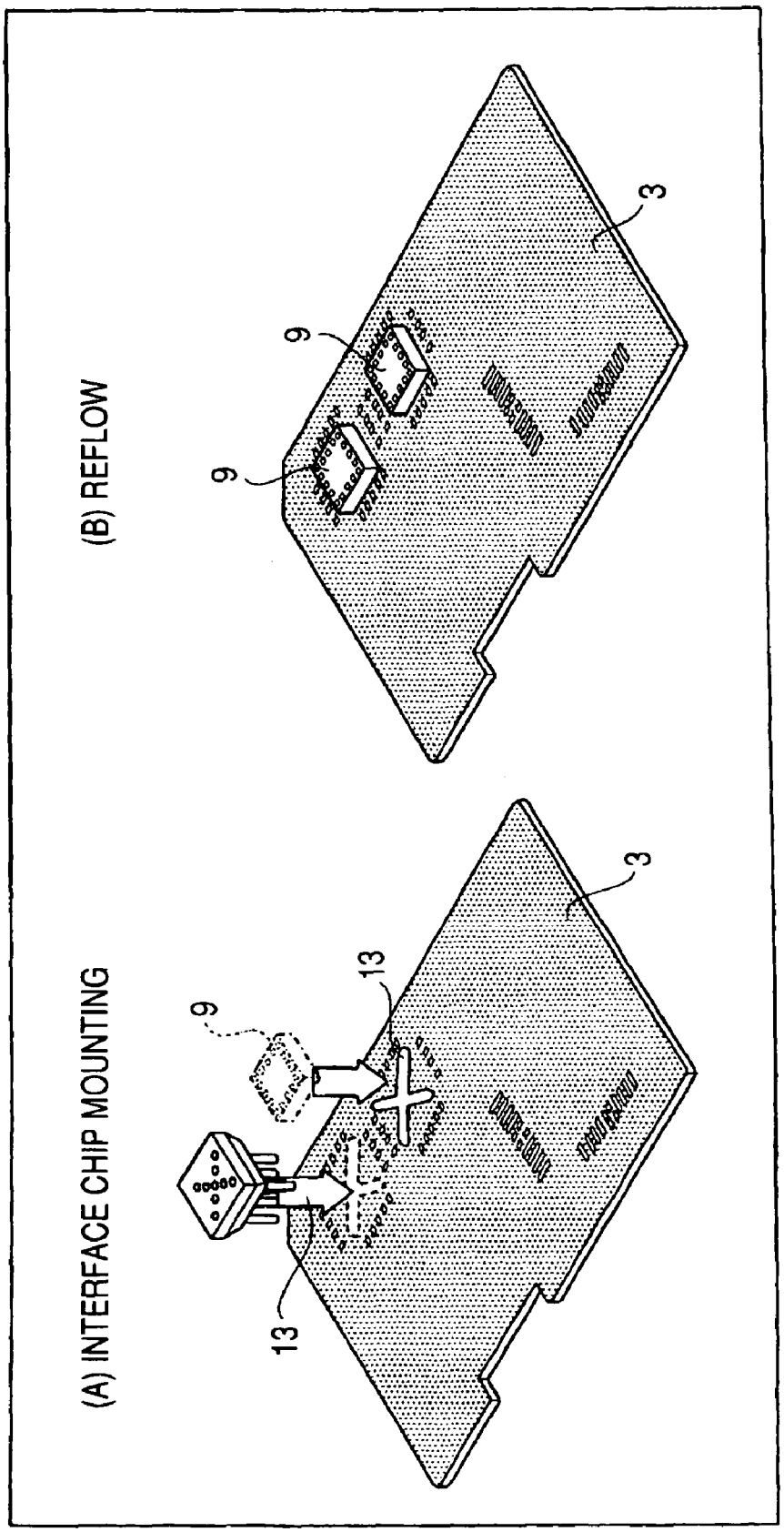
FIGS. 24A and 24B are perspective views showing an example of the mounting method of the interface chip in the die-bonding step of the assembly of the semiconductor device shown in FIG. 1.
Figure 25:
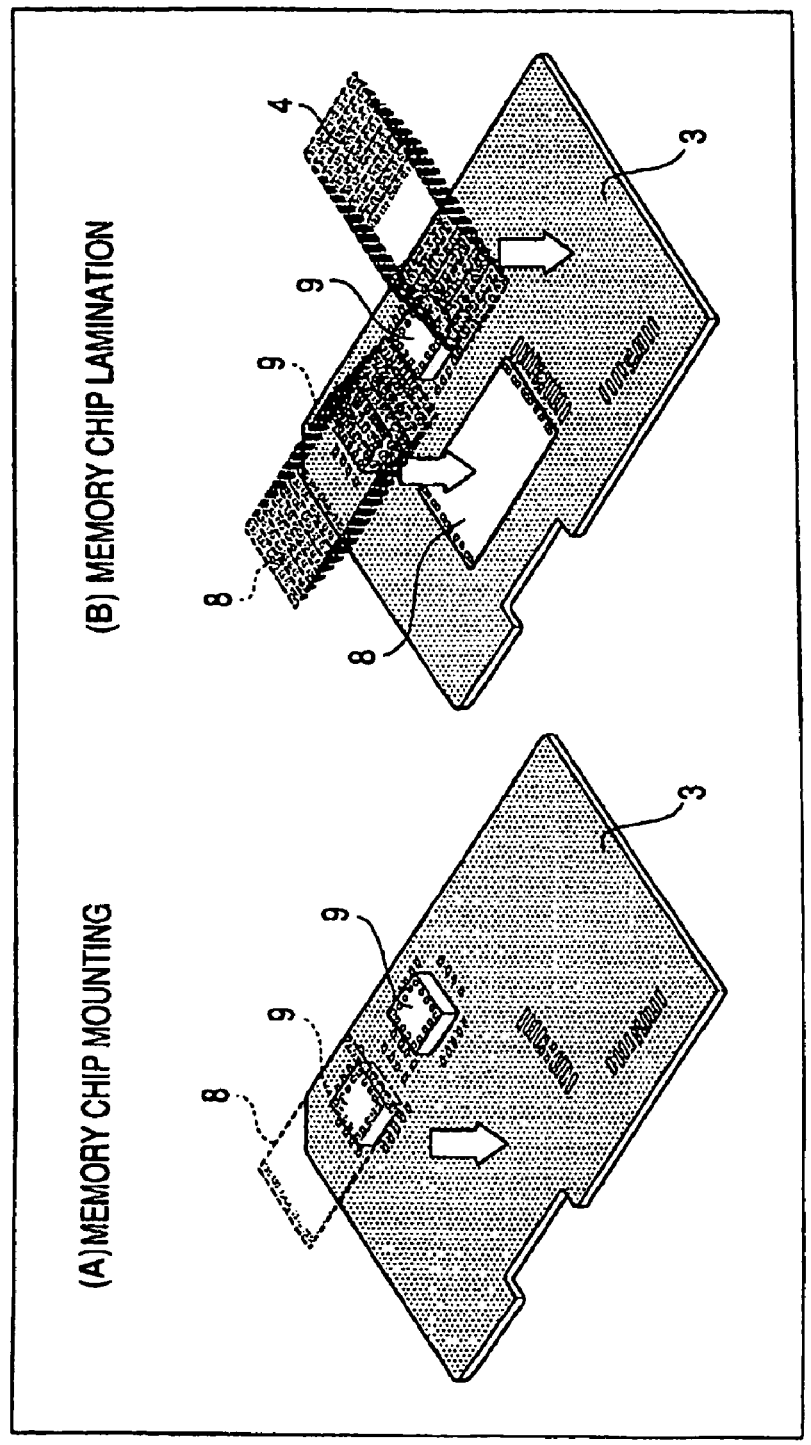
FIGS. 25A and 25B are perspective views showing an example of the mounting method of the memory chip in the die-bonding step of the assembly of the semiconductor device shown in FIG. 1.
Figure 27:
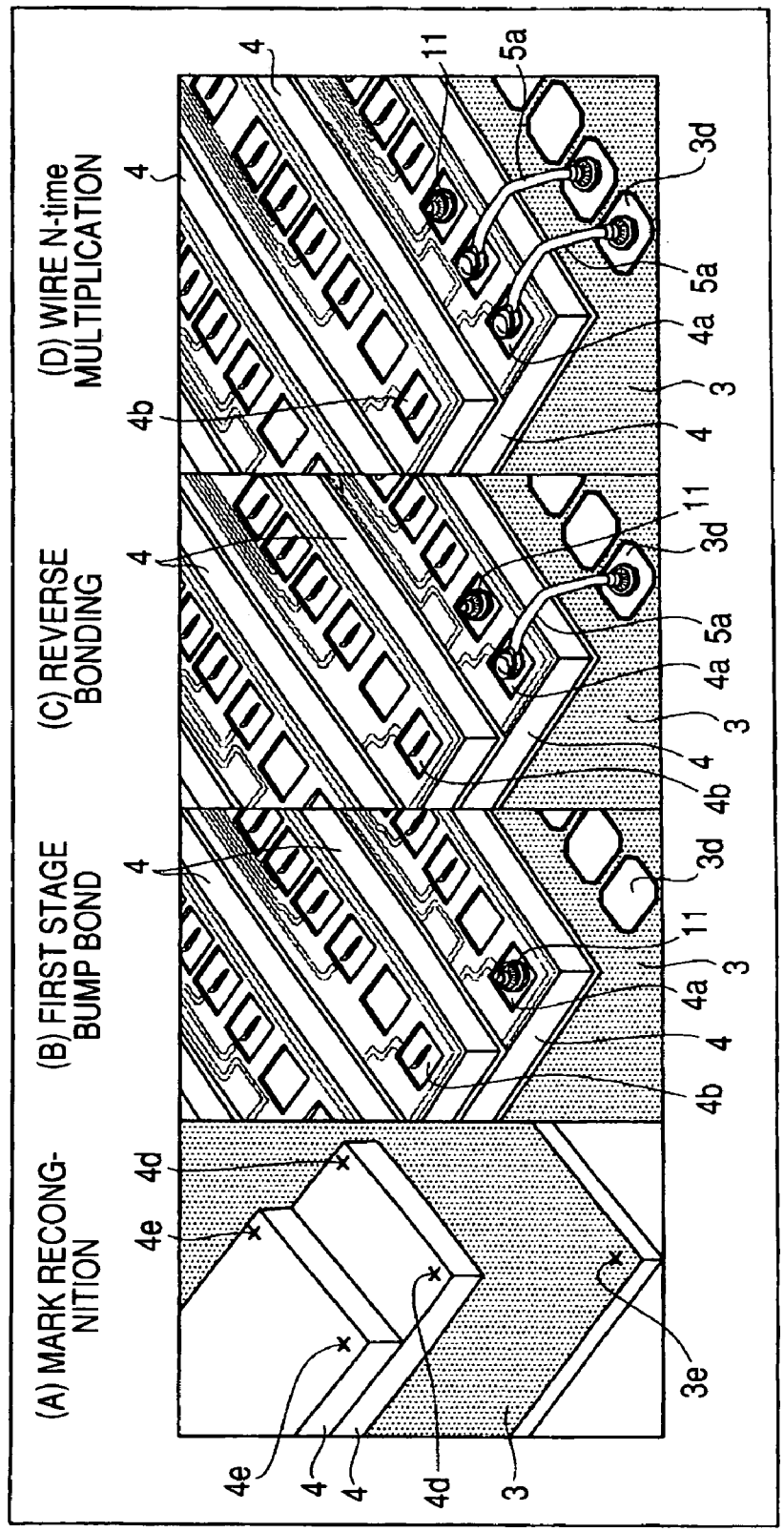
FIGS. 27A to 27D are perspective views showing an example of the wire bonding procedure of the semiconductor chip of the first stage in the wire bonding of a memory chip shown in FIG. 26.
Figure 28:
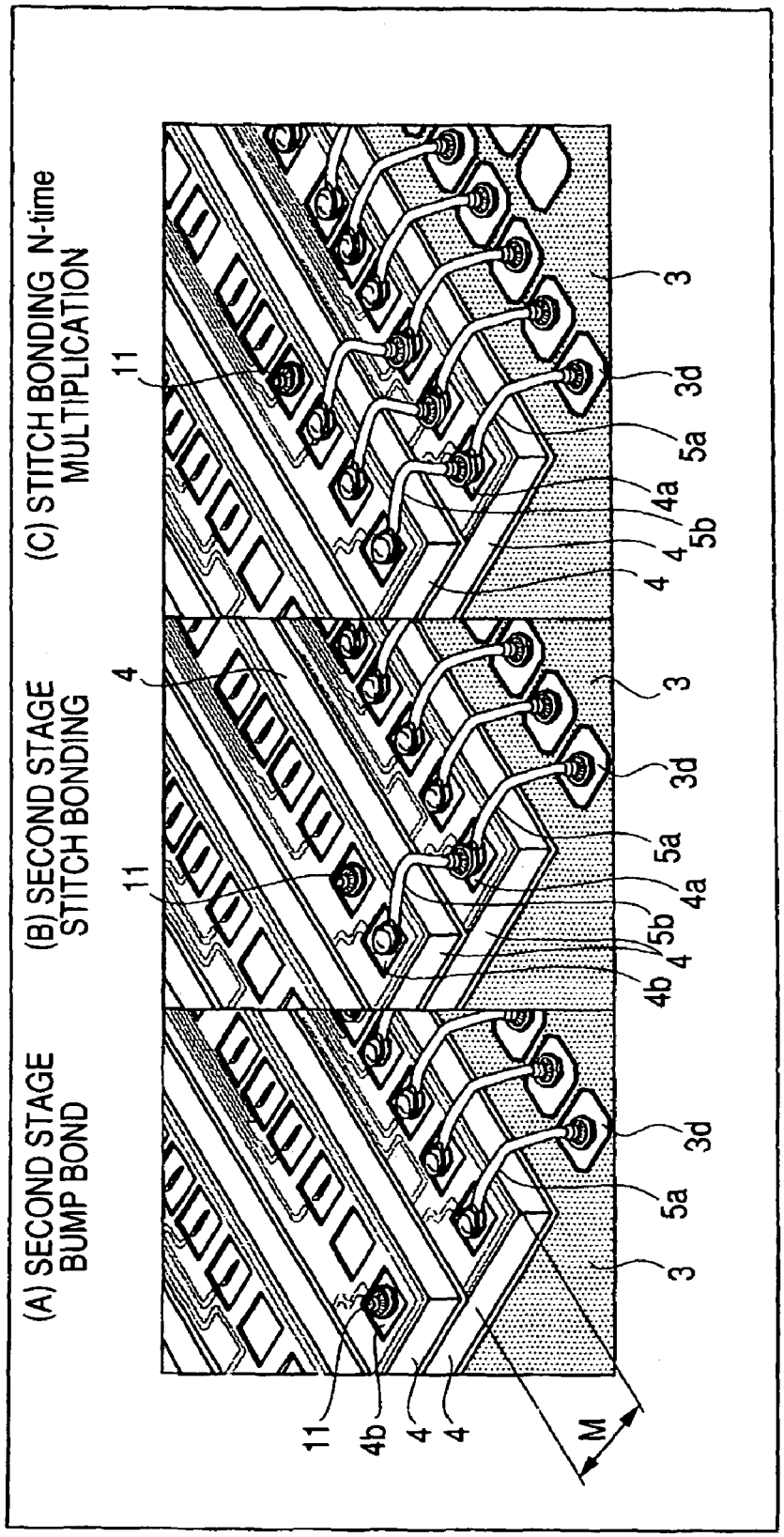
FIGS. 28A, 28B, and 28C are perspective views showing an example of the wire bonding procedure of the semiconductor chip of the second stage in the wire bonding of a memory chip shown in FIG. 26.

Further, FIG. 22 is a plan view showing only stitch bonding in the wiring for eight stages of a memory chip mounted in the semiconductor device shown in FIG. 1, FIG. 23 is a plan view showing an example of the structure of the multi-card substrate used for the assembly of the semiconductor device shown in FIG. 1, and FIGS. 24A and 24B are perspective views showing an example of the mounting method of the interface chip in the die-bonding step of the assembly of the semiconductor device shown in FIG. 1. FIGS. 25A and 25B are perspective views showing an example of the mounting method of the memory chip in the die-bonding step of the assembly of the semiconductor device shown in FIG. 1, FIGS. 26A and 26B are perspective views showing an example of the wire bonding method of the assembly of the semiconductor device shown in FIG. 1, and FIGS. 27A to 27B are perspective views showing an example of the wire bonding procedure of the semiconductor chip of the first stage in the wire bonding of a memory chip shown in FIG. 26. FIGS. 28A, 28B, and 28C are perspective views showing an example of the wire bonding procedure of the semiconductor chip of the second stage in the wire bonding of a memory chip shown in FIG. 26, FIGS. 29A, 29B, and 29C are perspective views showing an example of the wire bonding procedure of the semiconductor chip of the second to the third stage in the wire bonding of a memory chip shown in FIG. 26, and FIGS. 30A, 30B, and 30C are perspective views showing an example of the resin molding method in the assembly of the semiconductor device shown in FIG. 1.

Figure 31:
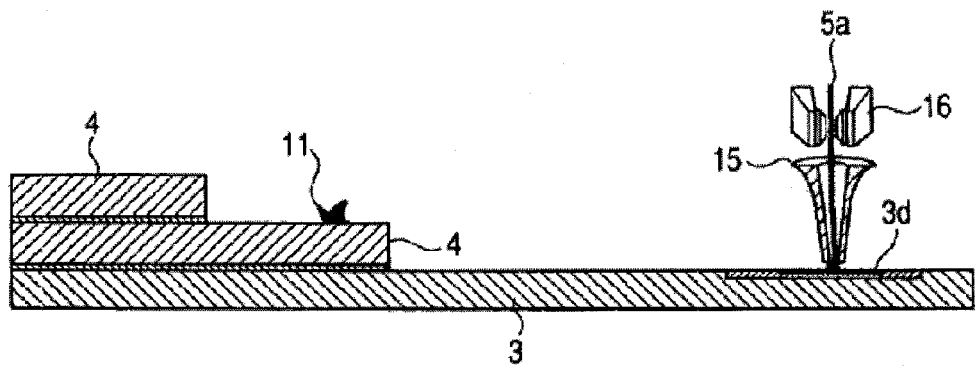
FIGS. 31 to 33 are side views showing an example of the reverse bonding procedure in the wire bonding of a memory chip of the assembly of the semiconductor device shown in FIG. 1.
Figure 32:
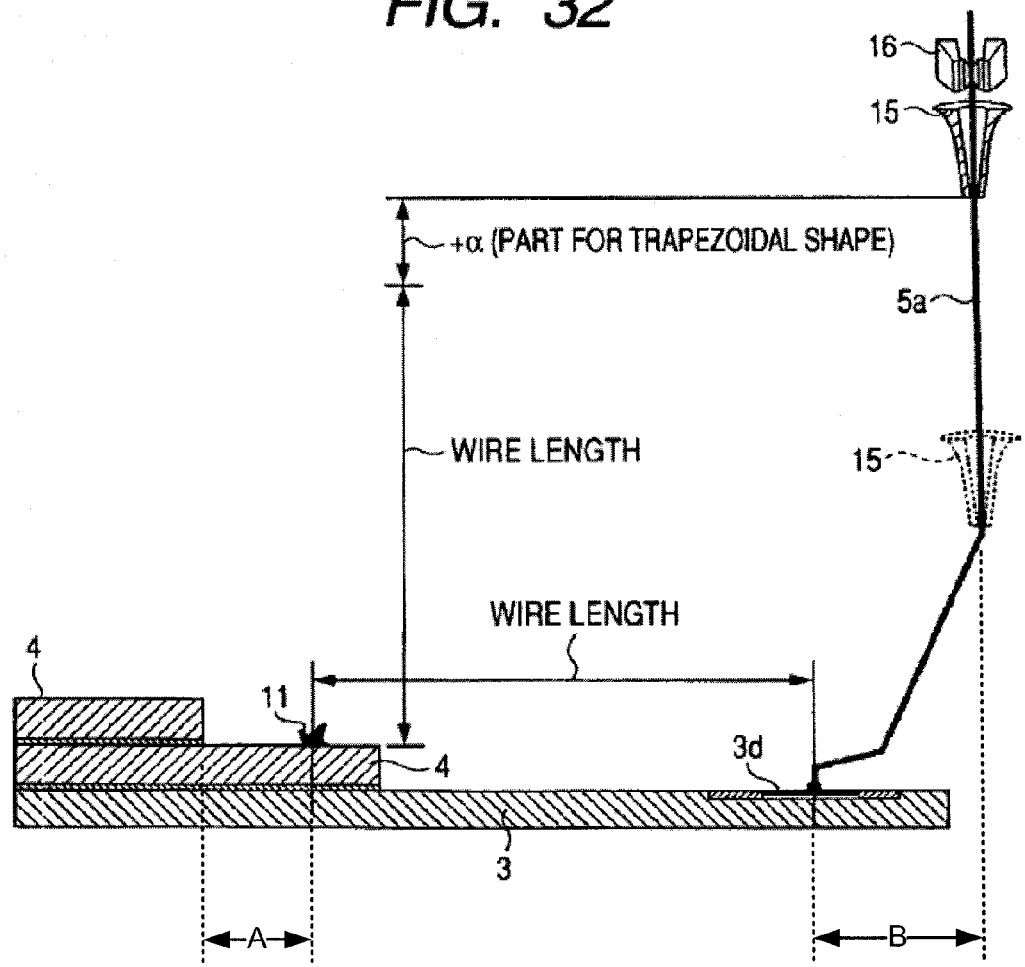
Figure 33:
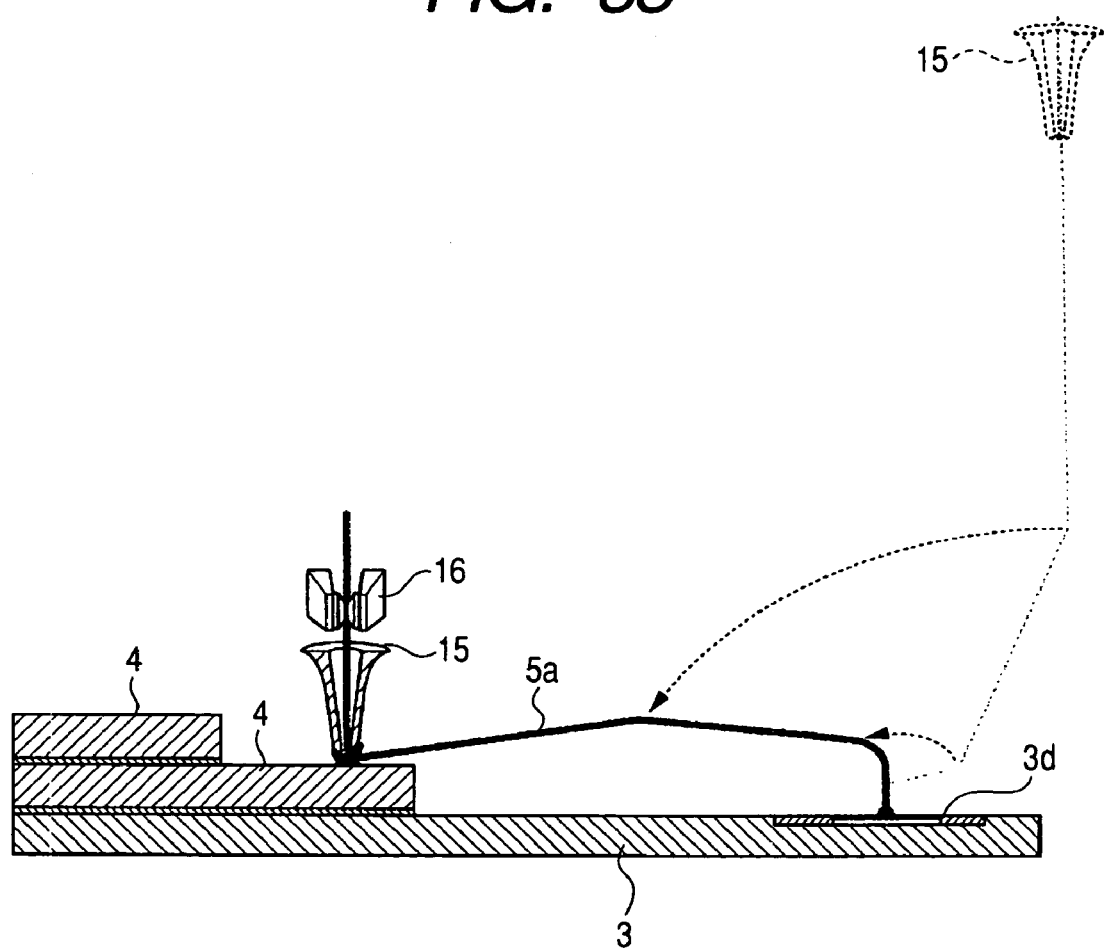
Figure 36:
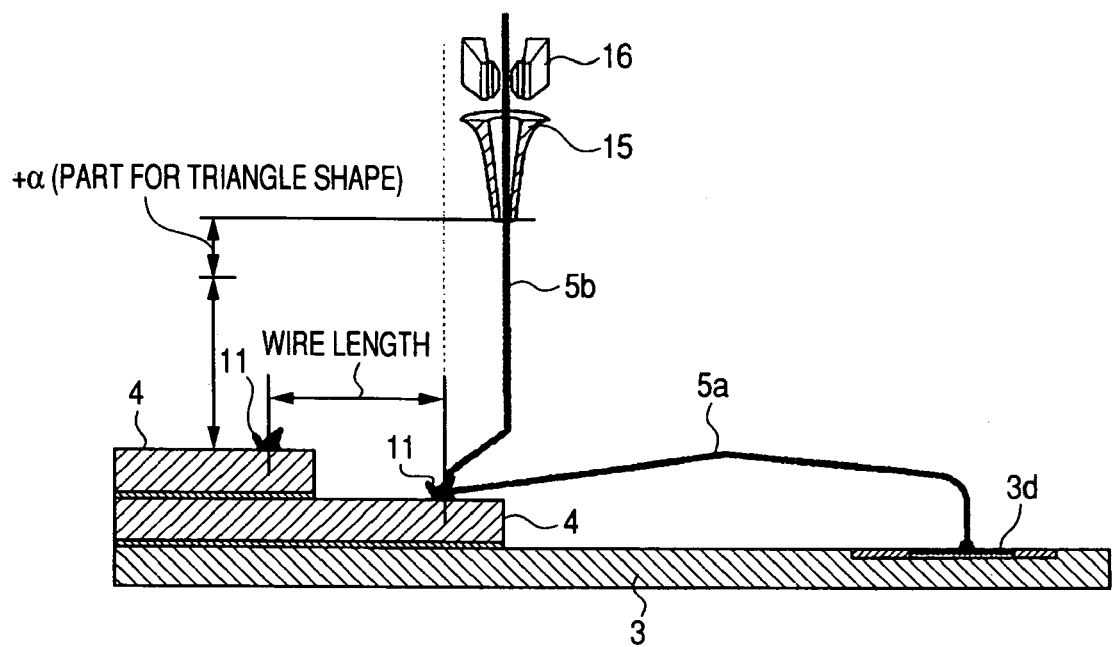
Figure 37:
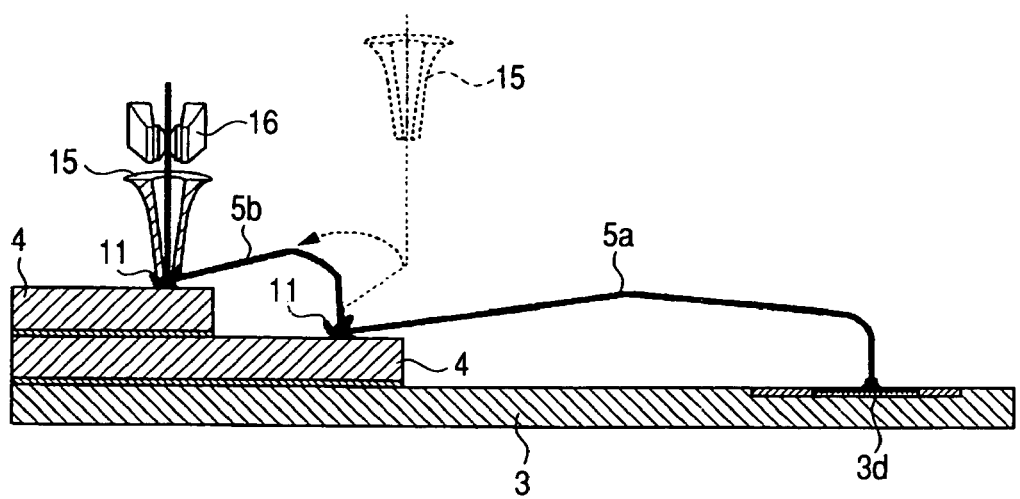
Figure 38:
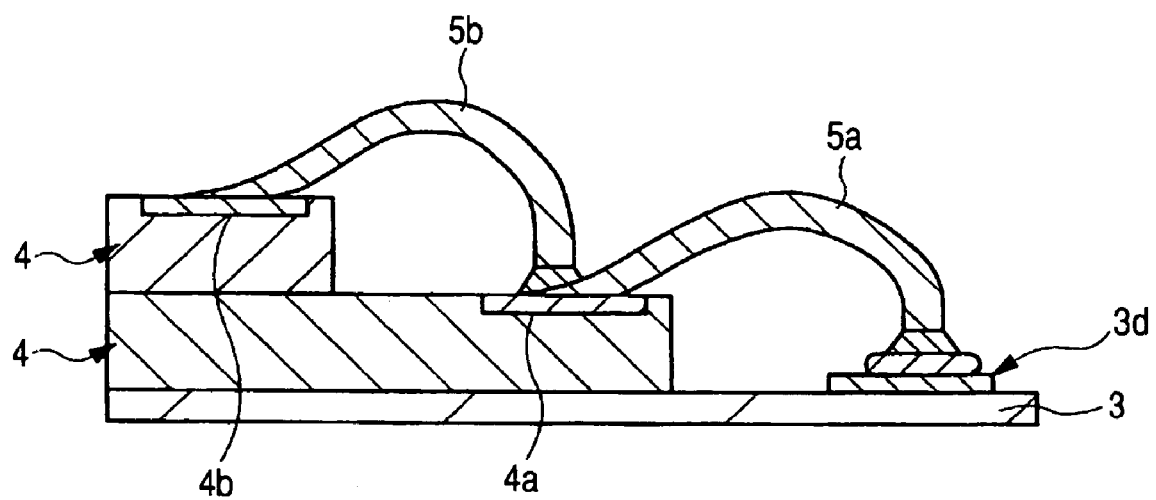
FIG. 38 is a partially sectional view showing the wiring state of the modification in the wire bonding of the assembly of the semiconductor device of the present invention.

FIGS. 31 to 33 are side views showing an example of the reverse bonding procedure in the wire bonding of a memory chip of the assembly of the semiconductor device shown in FIG. 1, respectively, FIGS. 34 to 37 are side views showing an example of the stitch-bonding procedure in the wire bonding of a memory chip of the assembly of the semiconductor device shown in FIG. 1, respectively, and FIG. 38 is a partially sectional view showing the wiring state of the modification in the wire bonding of the assembly of the semiconductor device of the present invention;

The semiconductor device of Embodiment 1 shown in FIG. 1-FIG. 6 is memory card 7 (card shape semiconductor device) available as an auxiliary storage device of electronic systems, such as information machines and equipment or telecommunication equipment, for example. This memory card 7 is the laminated small thing formed in plane rectangular shape, for example. Although memory card 7 of Embodiment 1 is called an SD card (there is a standard standardized at the SD card association), for example, memory card 7 is not limited to an SD card. For example, the technology described to the present application is applicable to a multimedia card (MMC: there is a standard standardized at the multimedia card association), a memory stick, etc.

When the structure of memory card 7 shown in FIG. 1-FIG. 6 is explained, substrate 3, a plurality of semiconductor chips mounted on the back-and-front surface, sealed part 10 which makes the resin seal of the semiconductor chips, a plurality of components 3b mounted on the back surface of substrate 3, a plurality of external terminals 3c formed on the back surface of substrate 3, and cap 1 which wraps, exposing only external terminal 3c outside, the other part of substrate 3 are included.

That is, as shown in FIG. 1 and FIG. 2, the external appearance of memory card 7 is covered with laminated cap 1, and a plurality of external terminals 3c are located in a line and arranged at the back surface side.

FIG. 3 shows the inside of sealed part 10 shown in FIG. 5, and a plurality of semiconductor chips are mounted on the front surface (main surface) of substrate 3. As shown in FIG. 4 and FIG. 5, controller chip 2 which was electrically connected to land 3a via ball electrode 6 and which is a chip for control, and a plurality of components 3b are mounted on the back surface of substrate 3.

As shown in FIG. 3 and FIG. 6, two interface chips 9, and memory chips (first memory chips) 4 and memory chips (second memory chips) 8 which were laminated to eight stages, respectively are mounted on the front surface (main surface) of substrate 3, and two interface chips 9, and memory chips 4 and memory chips 8 which were laminated to eight stages are electrically connected with the wirings (not shown) formed in substrate 3, respectively by wires 5 (for example, gold wire etc.).

Memory chip 4 laminated to eight stages is a chip of the same kind which equipped each with a memory circuit, and is a chip of the same size altogether eight stages. Each main surface of all eight stages of memory chips 4 accomplishes a rectangle. The memory circuit is a circuit which contributes to the memorization of information, and is a nonvolatile memory circuit or a flash memory circuit.

Similarly, memory chip 8 laminated to eight stages is also a chip of the same kind which equipped each with a memory circuit, and is a chip of the same size altogether eight stages. Each main surface of all eight stages of memory chips 8 accomplishes a rectangle, and the memory circuit is a circuit which contributes to the memorization of information, and is a nonvolatile memory circuit or a flash memory circuit.

Controller chip 2 which is a chip for control controls transmission and reception of the signal of memory chips 4 and memory chips 8, and the outside, and interface chip 9 controls transmission and reception of the signal of memory chips 4 and memory chips 8, and controller chip 2.

In memory card 7 of Embodiment 1, the over-bonding of reverse bonding by ball bonding is performed in the wire bonding of the I/O (signal) system terminal of memory chip 4 and memory chip 8 laminated to eight stages, respectively. In Embodiment 1, except a portion, the description of reverse bonding here means the method of performing the first bonding to the electrode (lead) of a substrate, and performing the second bonding to the terminal of a chip or the method of performing the first bonding to the terminal of a lower layer chip, and performing the second bonding to the terminal of the upper chip.

That is, as shown in the section A of FIG. 7, lead (first electrode) 3d of substrate 3, and pad 4a of memory chip 4 of the first stage which has been separated and arranged from lead 3d to the chip lamination direction and which is the second electrode are connected by first wire 5a by reverse bonding. Pad 4b of memory chip 4 of the second stage which has been separated and arranged from pad 4a to the chip lamination direction and which is the third electrode is similarly connected by second wire 5b by reverse bonding. The over-bonding of the first bonding side of second wire 5b is made on the second bonding side of first wire 5a on pad 4a of memory chip 4 of the first stage in the case.

Figure 8:
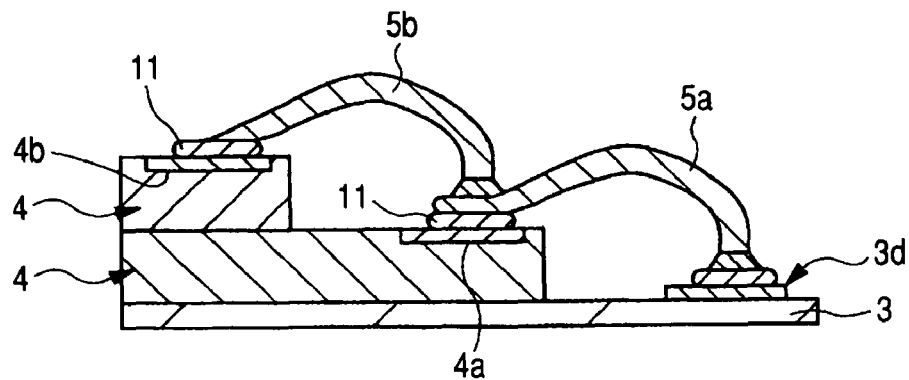
FIGS. 8 to 10 are partially sectional views showing an example of the wire bonding shown in FIG. 7.

The second bonding side of first wire 5a connected on pad 4a of memory chip 4 of the first stage, and the second bonding side of second wire 5b connected on pad 4b of memory chip 4 of the second stage are connected on bumps 11 beforehand connected on pads 4a and 4b, respectively, as shown in FIG. 8.

Figure 9:
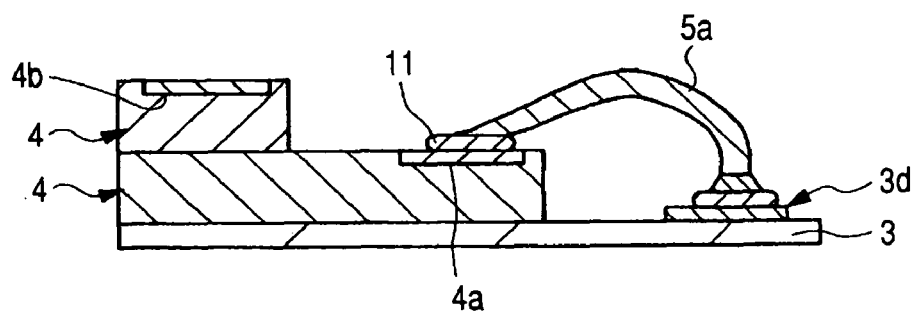

However, as shown in the section B of FIG. 7, in wire bonding of a power-source and a GND system terminal, etc., an over-bonding is not carried out, but as shown in FIG. 9, lead 3d of substrate 3 and pad 4a of memory chip 4 of the first stage are connected by reverse bonding with first wire 5a.

Figure 10:
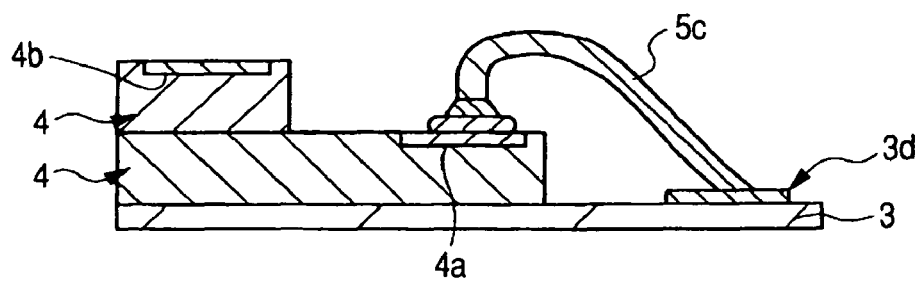
Figure 11:
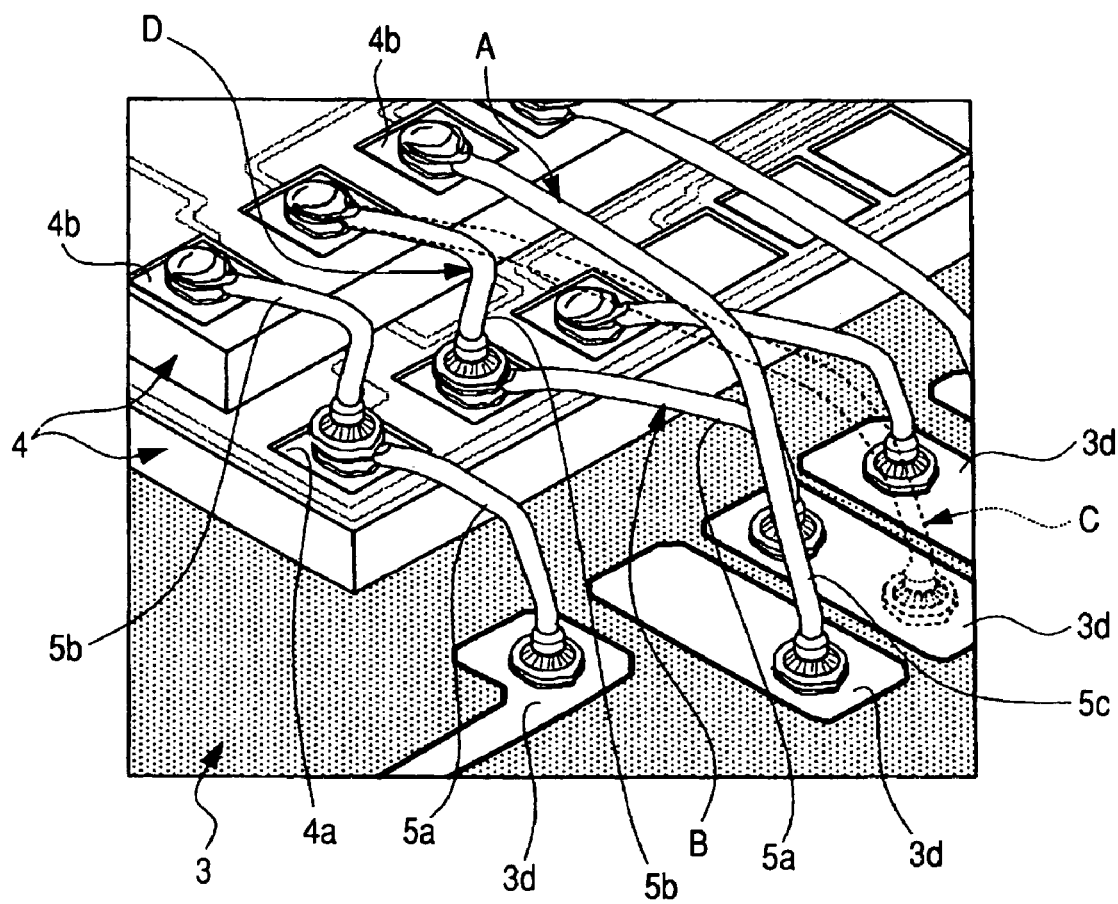
FIG. 11 is a fragmentary perspective view showing an example of the kind of wire bonding in the semiconductor device shown in FIG. 1.

As shown in the section C of FIG. 7, as for control-system wire (third wire) 5c whose one end is connected to memory chip 4 of the first stage, and the other end is connected to lead 3d which electrically leads to controller chip 2, reverse bonding does not necessarily need to be performed, but it may be connected by forward bonding as shown in FIG. 10. Wire 5 connected with a power source or a GND system terminal is also control-system wire 5c. Here, in Embodiment 1, the description of forward bonding means, except a portion, the method of performing the first bonding to the terminal of a chip and performing the second bonding to the electrode (lead) of a substrate or the method of performing the first bonding to the terminal of the upper chip, and performing the second bonding to the terminal of a lower layer chip.

Thus, in memory card 7 of Embodiment 1, as to the wire bonding of memory chip 4 laminated to eight stages, the over-bonding of reverse bonding by ball bonding or reverse bonding, and forward bonding are mixed (the same may be said of memory chip 8).

Although only the wire bonding of memory chip 4 of the first stage and memory chip 4 of the second stage is shown in FIG. 7, in memory card 7 of Embodiment 1, as to the wire bonding of an I/O (signal) system terminal at least from memory chip 4 of the first stage to memory chip 4 of the eighth stage, the over-bonding of reverse bonding by ball bonding is performed (the same may be said of memory chip 8).

As for the connection of control-system wire 5c to memory chip 4 of the stage more than the second stage, as shown in the section A of FIG. 11, it is preferred that it is reverse bonding. In control-system wire 5c connected to memory chip 4 of the stage more than the second stage, in order to make it connect with the location of the outside of the lower stage side wire from the chip of the upper stage to substrate 3, it is preferred that lead 3d is formed in the rectangle extended and existed in the wiring direction.

By this, control-system wire 5c connected to memory chip 4 of the stage more than the second stage can be made to connect to rectangular lead 3d by reverse bonding, intersecting first wire 5a (section B of FIG. 11) or second wire 5b with which the over-bonding by reverse bonding was performed in the inside.

Thus, the location where bonding of the control-system wire 5c is made can be made into the location distant from memory chip 4 by making lead 3d into a quadrangular (here, a rectangle or a parallelogram being exemplified) configuration of having a short side and a long side. Namely, bonding of wire 5a which connects chip 4 of the first stage, and lead 3d is made to the region which approaches the chip 4 side in the region of lead 3d, and bonding of the control-system wire 5c which connects chip 4 of the second stage and lead 3d is made to the region of the direction which separates from the chip 4 side in the region of lead. For this reason, as shown in FIG. 11, even if it is a case where chip 4 is laminated by many stages, it can become possible to make a wire cross and to connect with respective chips, without contacting wires, and improvement in packaging density can be aimed at, improving the degree of freedom of a chip layout.

As shown in the below-mentioned FIG. 12 etc., even when lead 3d of the second row has been arranged in the direction which separates from chip 4 instead of making lead 3d into the quadrangle which has a short side and a long side, it becomes possible like above mentioned matter to make a wire cross and to connect with respective chips, without contacting wires. The same effect can be acquired also when using it combining the lead of the above-mentioned quadrangle which has a short side and a long side, and the lead of the second row.

A line with a bigger diameter than another wires 5 may be adopted only for control-system wire 5c. That is, the inductance of control-system wire 5c can be lowered by making into a line with the larger diameter than another wires 5 control-system wire 5c connected with a power source or a GND system terminal.

According to memory card 7 of Embodiment 1, by performing an over-bonding of reverse bonding by ball bonding to the laminated semiconductor chips, it becomes possible to form wire 5 of two directions on the pad of a semiconductor chip, and, hereby, an effect equivalent to continuation stitch bonding of wedge bonding can be produced by ball bonding.

That is, since it is ball bonding, a small pad can be made to correspond.

Even if it is a small pad, it is possible to perform bonding in the two directions.

It is possible to adopt the semiconductor chip which does not include a rectangle pad.

Since the direction of wiring is changeable unlike stitch bonding of the wedge bond, also as opposed to the wiring pattern that wires contact in reverse bonding of the former (dotted-line part) as shown in the section C of FIG. 11, by making it as the over-bonding of reverse bonding with second wire 5b as shows this to the section D of FIG. 11, it becomes possible to connect without contacting wires.

Hereby, the wiring of a semiconductor chip, redesigning of lead 3d, etc. can be reduced.

By making reverse bonding of the section C of FIG. 11 into the over-bonding of reverse bonding with second wire 5b of the section D of FIG. 11, wire length can be shortened, and reduction of the cost of chip lamination type memory card 7 can be aimed at, reducing the cost concerning wire 5.

Next, FIG. 12-FIG. 22 show the connection state of each pad in memory chip 4 (the same may be said of memory chip 8) laminated by eight stages, and lead 3d of substrate 3 corresponding to this. Among these, FIG. 12 shows all the connection states of memory chip 4 from the first stage to the eighth stage, and FIG. 13 shows all the connection states of memory chip 4 from the first stage to the fourth stage.

FIG. 14-FIG. 21 show the connection state of memory chip 4 for every stage from the first stage to the eighth stage. As control division, they are divided into two systems from the fifth stage to the eighth stage with the first stage to the fourth stage. That is, as shown in FIG. 14 and FIG. 18, in memory chip 4 of the first stage, and memory chip 4 of the fifth stage, there are far many connection numbers with lead 3d of substrate 3 compared with memory chip 4 of other stages. Memory chip 4 of the first stage and memory chip 4 of the fifth stage are connected with a plurality of I/O (signal) system terminals, and a power source and GND system terminals, such as a plurality of VSS(s), VCC(s), etc., respectively. While memory chips 4 of the first stage and the second stage are connected with the chip side (inside) of rectangular leads 3d in connection with lead 3d of substrate 3 as shown in FIG. 14 and FIG. 15, memory chip 4 of the stage more than or equal to the third stage is connected to the outside of rectangular lead 3d as shown in FIG. 16-FIG. 21.

FIG. 22 picks up and shows only the over-bonding portion of reverse bonding by ball bonding in eight stages of chip laminating sections, and being divided into two systems of the first stage to the fourth stage and from the fifth stage to the eighth stage, is shown.

Next, the manufacturing method of the semiconductor device (memory card 7) of Embodiment 1 is explained. The assembly of memory card 7 is performed using multi-card substrate 12 shown in FIG. 23.

First, die bonding is performed in each device region of multi-card substrate 12. At a die-bonding step, first, as shown in FIGS. 24A and 24B, two interface chips 9 are mounted, and as shown in FIGS. 25A and 25B after that, memory chip 4 and memory chip 8 are laminated to eight stages, respectively.

As shown in FIGS. 24A and 25B, first, paste material 13 is applied on substrate 3, and further, interface chips 9 are arranged from the upper part of paste material 13, and they are adhered by reflow after that.

Then, as shown in FIGS. 25A and 25B, memory chip 4 and memory chip 8 are accumulated one by one, respectively, and they are laminated to eight stages. A tape with an adhesive layer etc. is used for connection of memory chip 4 and memory chip 8, for example.

Then, as shown in FIGS. 26A and 26B, wire bonding of respective chips is performed. As shown in FIG. 26A, first, wire bonding of interface chip 9 is performed, and as shown in FIG. 26B after that, wire bonding of memory chip 4 and memory chip 8 is performed.

First, as shown in FIG. 26A, interface chip 9 is electrically connected to substrate 3, performing wire bonding to two interface chips 9. In the case, as shown in the enlarged view of FIG. 26A, all wire bonding of interface chip 9 is performed by forward bonding.

Then, as shown in FIG. 26B, wire bonding of memory chip 4 and memory chip 8 is performed.

In the wire bonding of memory chip 4 and 8, first, as shown in FIG. 27A, mark recognition of substrate 3 and memory chip 4 is performed. Mark (first mark) 3e formed on the front surface (main surface) of substrate 3 and mark (second mark) 4d on memory chip 4 separated and arranged from this to the chip lamination direction are recognized in the case.

That is, the location of mark 3e of substrate 3 and the location of mark 4d of memory chip 4 arranged at the location higher than this are recognized, respectively.

Then, a location of each lead 3d is computed using the coordinates prepared beforehand of a plurality of leads 3d of the front surface of substrate 3. Similarly, the location of each pad 4a of memory chip 4 arranged at the location higher than each lead 3d is computed.

Then, based on the recognition result of the location of lead 3d, the point formed in ball state of first wire 5a is connected to lead 3d. In the case, first, as shown in FIG. 27B, the first stage bump bond is performed to pad 4a of memory chip 4. That is, bump 11 is connected to pad 4a. Then, reverse bonding shown in FIG. 27C is performed.

First, the point formed in ball state of first wire 5a is connected to lead 3d. Then, first wire 5a is pulled out from lead 3d, and is arranged on pad 4a based on the recognition result of the location of pad 4a of the first stage. Then, a part of first wire 5a is crushed, and is connected with pad 4a of the first stage. A part of first wire 5a is connected to bump 11 on pad 4a of the first stage of memory chip 4 in the case. Thus, by forming bump 11 on pad 4a beforehand, and performing second bonding of reverse bonding to this bump 11, it can be prevented that a capillary contacts pad 4a at the time of reverse bonding, and memory chip 4 is damaged.

This becomes the completion of reverse bonding shown in FIG. 27C.

FIG. 31-FIG. 33 show the locus of operation of capillary 15 at the time of reverse bonding. As shown in FIG. 31, first, bump 11 is connected to pad 4a of memory chip 4 of the first stage, and as shown in FIG. 32 after that, with damper 16, capillary 15 is raised and arranged. As shown in FIG. 32, a horizontal distance A from a first bump (i.e., bump 11) to an edge of a third component (i.e., memory chip 4) is less than a horizontal movement distance B of a reverse operation of the capillary 15 from a first electrode (i.e., lead 3d) to a first position. As shown in FIG. 33, a part of first wire 5a is connected to bump 11 on pad 4a of memory chip 4 of the first stage. Then, first wire 5a is cut and reverse bonding to memory chip 4 of the first stage is completed.

Then, toward a plurality of other leads 3d formed in the same surface as lead 3d and a plurality of other pads 4a formed in the same surface as pad 4a of memory chip 4 of the first stage, the other leads 3d and the other pads 4a corresponding to these are similarly connected by reverse bonding with first wire 5a one by one.

That is, reverse bonding is performed similarly and the remaining pad 4a of memory chip 4 of the first stage, and lead 3d of the front surface of substrate 3 corresponding to this are connected. In the case, as shown in FIG. 27C, first, bump 11 is formed on pad 4a of memory chip 4 of the first stage, and as shown in FIG. 27D after that, lead 3d, and bump 11 on pad 4a are connected by reverse bonding. Thus, all reverse bonding with lead 3d of substrate 3 is performed to memory chip 4 of the first stage.

Then, as shown in FIGS. 28A, 28B, and 28C, reverse bonding is performed to memory chip 4 of the second stage. First, bump bonding to memory chip 4 of the second stage shown in FIG. 28A is performed. Recognizing mark (third mark) 4e which has been separated and arranged from mark 4d of memory chip 4 of the first stage to the chip lamination direction and which is shown in FIG. 27A first in the case, the location of pad (third electrode) 4b of memory chip 4 of the second stage separated and arranged from pad 4a of memory chip 4 of the first stage to the chip lamination direction is asked for.

That is, recognizing mark (third mark) 4e arranged in the location higher than mark 4d of memory chip 4 of the first stage, the location of pad (third electrode) 4b of memory chip 4 of the second stage arranged in the location higher than pad 4a of memory chip 4 of the first stage is asked for. Then, bump 11 is connected to pad 4b of memory chip 4 of the second stage as shown in FIG. 28A.

Then, as shown in FIG. 28B, reverse bonding is performed and pad 4a of memory chip 4 of the first stage and pad 4b of memory chip 4 of the second stage are connected. Here, the point formed in ball state of second wire 5b is first connected to first wire 5a on pad 4a of memory chip 4 of the first stage.

Then, second wire 5b is pulled out from pad 4a, and is arranged on pad 4b based on the recognition result of the location of pad 4b. Then, crushing a part of second wires 5b by bump 11, second wire 5b is connected on bump 11 beforehand connected to pad 4b.

This completes reverse bonding as shown in FIG. 28B.

Figure 34:
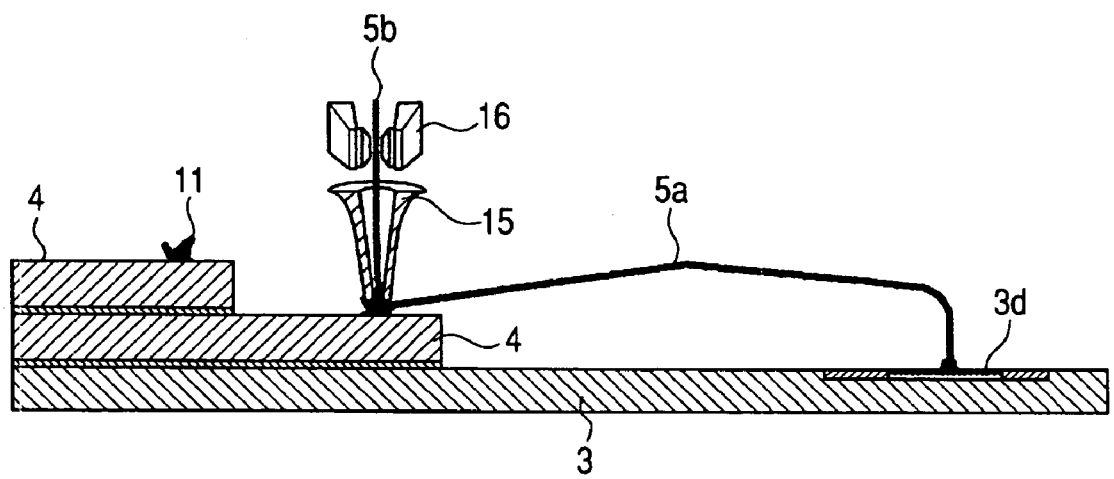
FIGS. 34 to 37 are side views showing an example of the stitch-bonding procedure in the wire bonding of a memory chip of the assembly of the semiconductor device shown in FIG. 1.
Figure 35:
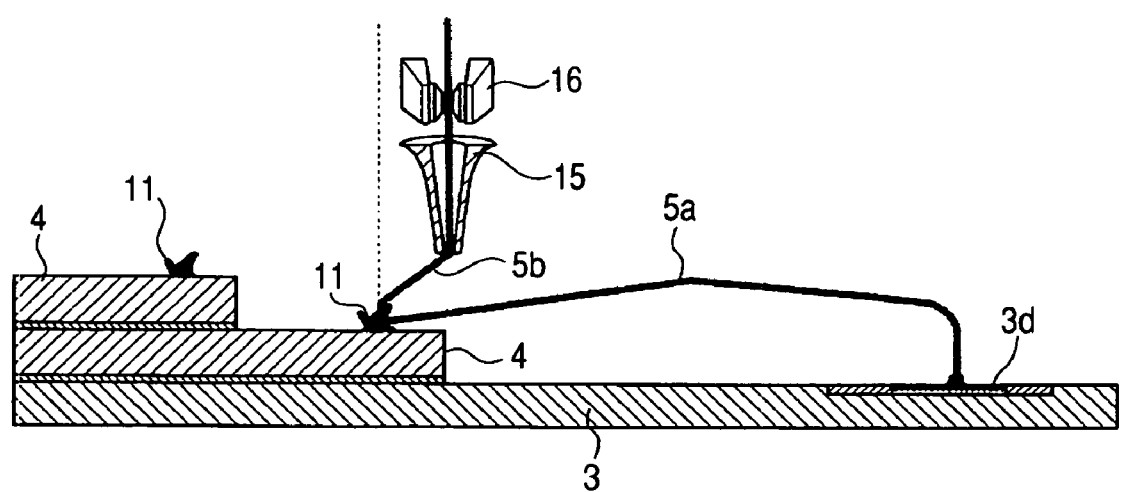

FIG. 34-FIG. 37 show the locus of operation of capillary 15 at the time of performing reverse bonding from memory chip 4 of the first stage to memory chip 4 of the second stage. As shown in FIG. 34, first, bump 11 is connected to pad 4b of memory chip 4 of the second stage, as shown in FIG. 35 after that, capillary 15 is made to stand up to a reverse direction to the wiring (reverse operation), and further as shown in FIG. 36, capillary 15 is raised and arranged.

Then, as shown in FIG. 37, a part of second wire 5b is connected to bump 11 on pad 4b of memory chip 4 of the second stage. Then, second wire 5b is cut and reverse bonding to memory chip 4 of the second stage is completed.

Since first wire 5a connected on pad 4a of memory chip 4 of the first stage is arranged low enough by reverse bonding when performing first bonding of second wire 5b on first wire 5a on pad 4a of memory chip 4 of the first stage, even if capillary 15 performs reverse operation, it can be prevented that capillary 15 contacts first wire 5a.

Further, the second bonding is performed after performing the first bonding to pad 4a of memory chip 4 of the first stage. In the case, since capillary 15 moves to the direction which separates from memory chip 4 (reverse operation) once, distance M shown in FIG. 28 (A) can be shortened.

As a result, since it can be arranged densely when laminating memory chips 4, the mounting space of memory chips 4 on substrate 3 can be reduced.

Then, toward a plurality of other pads 4a formed in the same surface as pad 4a and a plurality of other pads 4b formed in the same surface as pad 4b of memory chip 4 of the second stage, the other pads 4a and the other pads 4b of corresponding to these are similarly connected, making reverse bonding with second wire 5b one by one.

That is, reverse bonding is performed similarly and the remaining pad 4b of memory chip 4 of the second stage and pad 4a of memory chip 4 of the first stage corresponding to this are connected. In the case, as shown in FIG. 28B, first, bump 11 is formed on pad 4b of memory chip 4 of the second stage, and as shown in FIG. 28C after that, pad 4a, and bump 11 on pad 4b are connected by reverse bonding of second wire 5b. Thus, reverse bonding with memory chip 4 of the first stage is performed to all the desired pads to memory chip 4 of the second stage.

Figure 29:
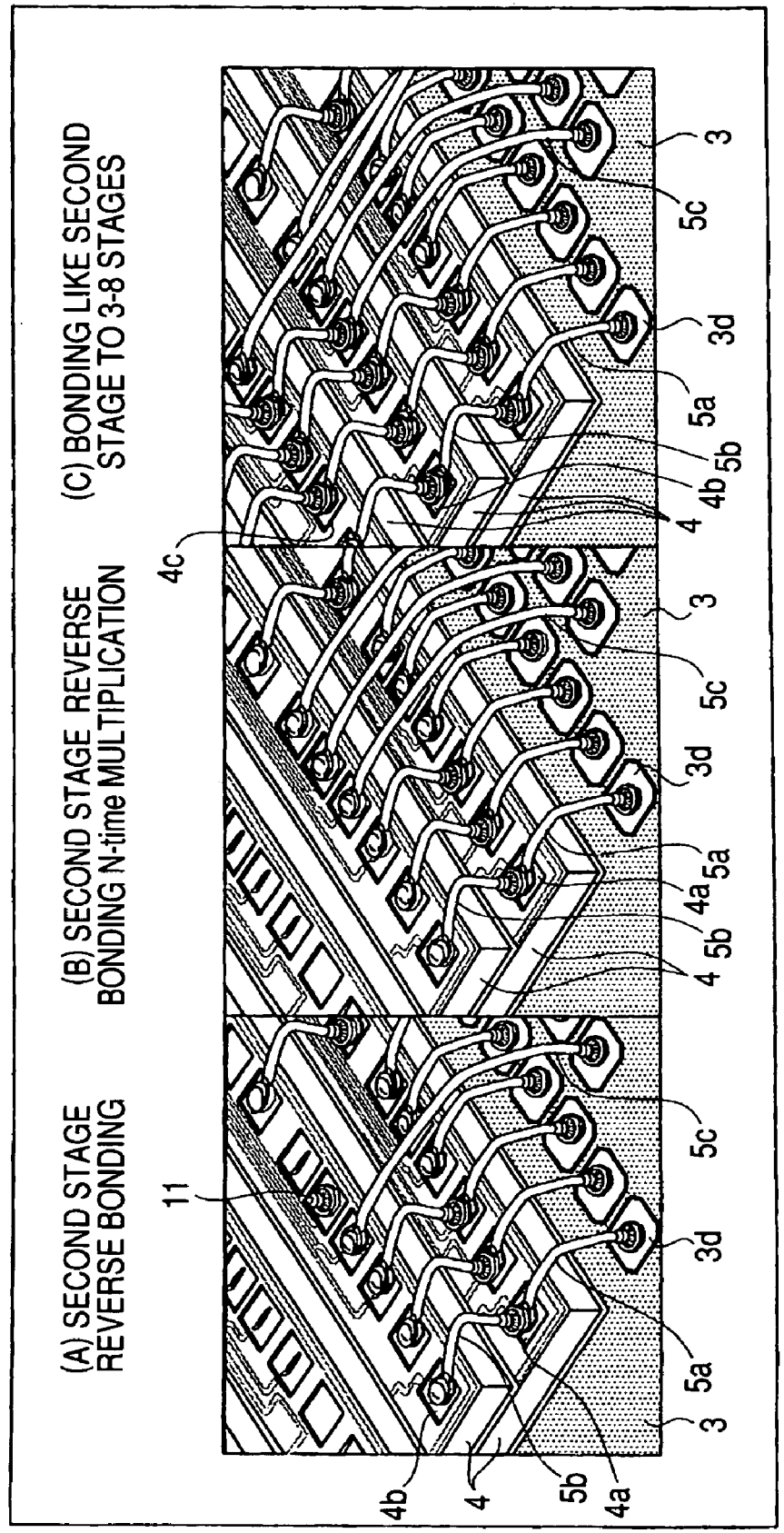
FIGS. 29A, 29B, and 29C are perspective views showing an example of the wire bonding procedure of the semiconductor chip of the second to the third stage in the wire bonding of a memory chip shown in FIG. 26.

As shown in FIG. 29A, in wiring directly, pad 4b of memory chip 4 of the second stage, and lead 3d of substrate 3 are connected by reverse bonding like control-system wire 5c. As shown in FIG. 29B, when there are a plurality of pads 4b which directly wire to lead 3d of substrate 3, they are connected with substrate 3 by reverse bonding at the wire bonding step of memory chip 4 of the second stage.

As shown in FIG. 29C, wire bonding is made also with the third to the eighth stages of memory chip 4 in the same procedure as the wire bonding of memory chip 4 of the second stage. That is, pad 4c of memory chip 4 of the third stage and pad 4b of memory chip 4 of the second stage are connected by reverse bonding.

That is, the wire bonding method of Embodiment 1 is the method of connecting each terminal of a chip of the first stage with each electrode (lead) of a substrate first, and connecting each terminal of the chip of the first stage, and each terminal of a chip of the second stage after that. The same may be said of the third to the eighth stages of the chip upper than the chip of the second stage.

Thus, in the wire bonding method of Embodiment 1, only one recognition is performed for one stage of every chip also including recognition by substrate 3. That is, since it recognizes only once for every stage, the number of times of recognition can be reduced substantially. When the number of times of recognition increases, the error of the location of one recognition will be integrated as a result, and the accuracy of position of recognition will worsen. Reverse bonding is a bonding manner weak to a location drift. Therefore, in the wire bonding method of Embodiment 1, since only one recognition is performed for every stage, it is the recognition method of a location that could raise the accuracy of position of recognition and as a result it was suitable for reverse bonding.

Resin molding shown in FIGS. 30A, 30B, and 30C is performed after wire bonding completion.

That is, resin 14 for sealing is injected from resin flow direction A of FIGS. 30A and 30B, heating and application of pressure are performed, and sealed part 10 is formed as shown in FIG. 30C. This becomes resin molding completion.

Figure 30:
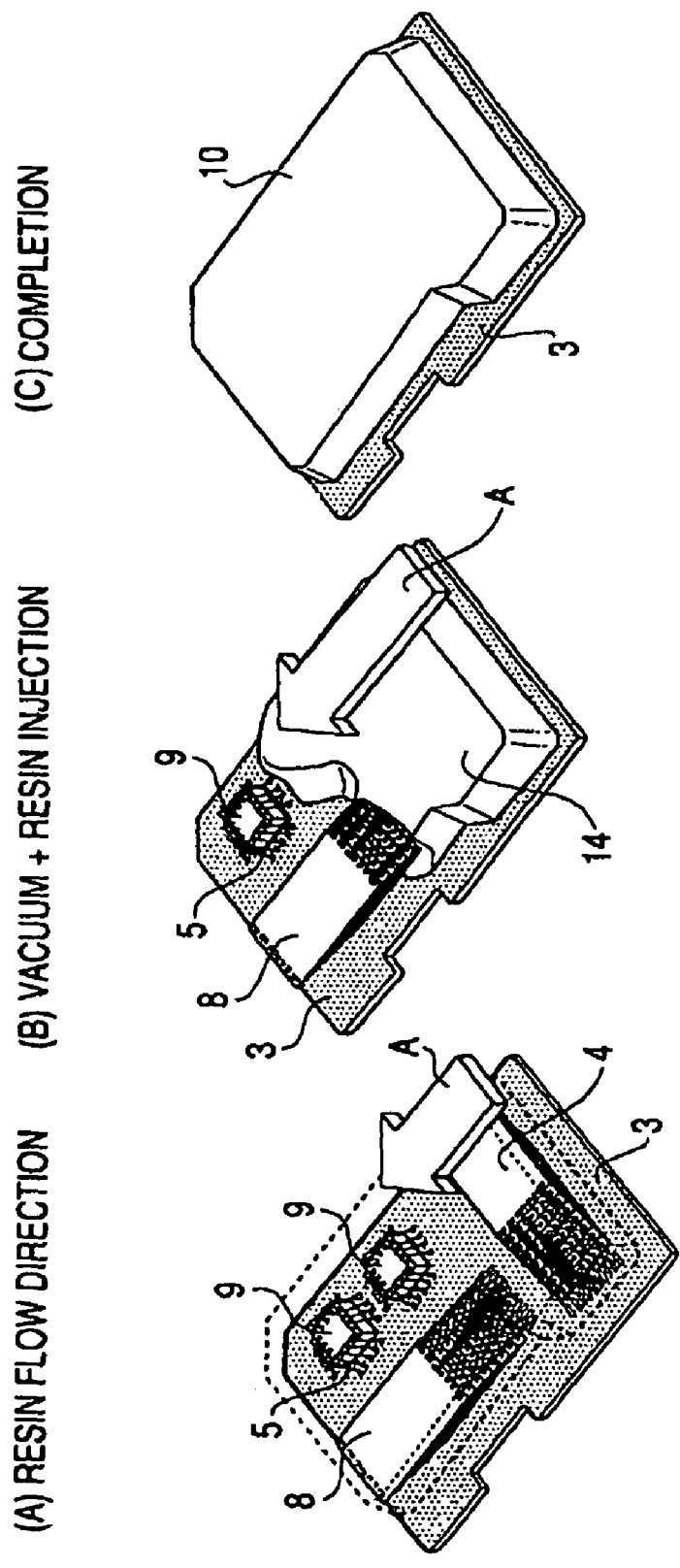
FIGS. 30A, 30B, and 30C are perspective views showing an example of the resin molding method in the assembly of the semiconductor device shown in FIG. 1.

After resin molding completion, it may be shipped with the form shown in FIG. 30 (C), for example. In that case, controller chip 2 is mounted on the back surface of substrate 3, cap 1 is attached further, and it becomes a finished product of semiconductor devices, such as memory card 7, in the destination.

For example, controller chip 2 is mounted on the back surface of substrate 3 after resin molding completion, cap 1 may be attached further, semiconductor devices, such as memory card 7, may be completed, and this semiconductor device may be shipped.

According to the manufacturing method of memory card 7 of Embodiment 1, since it becomes possible to form the wire of two directions on the pad of laminated semiconductor chips, such as memory chip 4, an effect equivalent to continuation stitch bonding of wedge bonding can be produced by ball bonding.

Hereby, the degree of freedom of a chip layout and the degree of freedom of the terminal layout of a substrate can be improved, and the packaging density on a substrate in a chip lamination type semiconductor device (memory card 7) can be improved.

Next, the modification of Embodiment 1 is explained. The modification shown in FIG. 38 makes direct continuation of first wire 5a or the second wire 5b to pad 4a or pad 4b, without making bump 11 intervene, when performing second bonding to memory chip 4 by reverse bonding.

The step which connects bump 11 can be skipped by this, and shortening of the time of reverse bonding can be aimed at.

Embodiment 2

Figure 39:
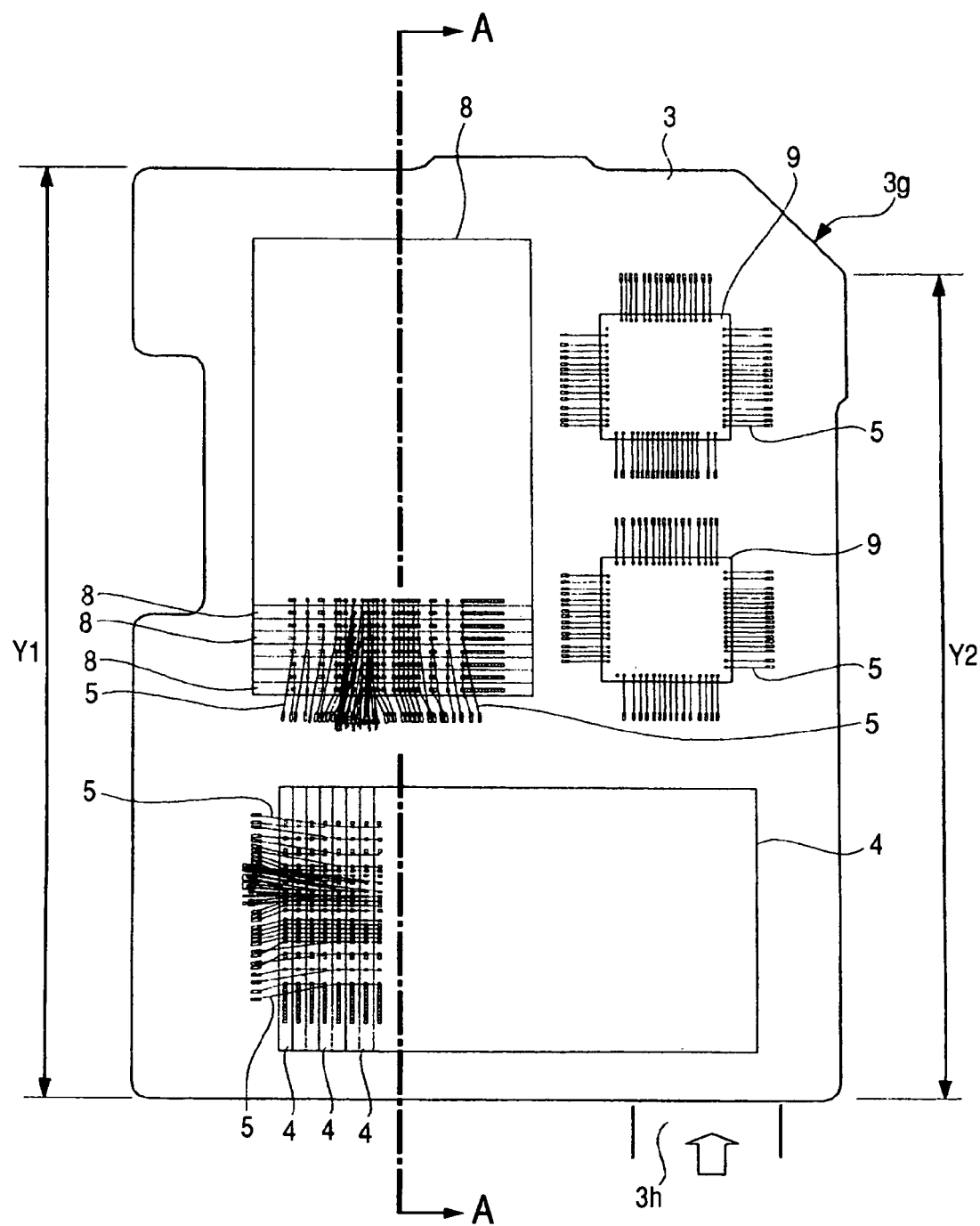
FIG. 39 is a plan view showing an example of the component mounting layout of the front surface side of the substrate in the semiconductor device of Embodiment 2 of the present invention.
Figure 40:
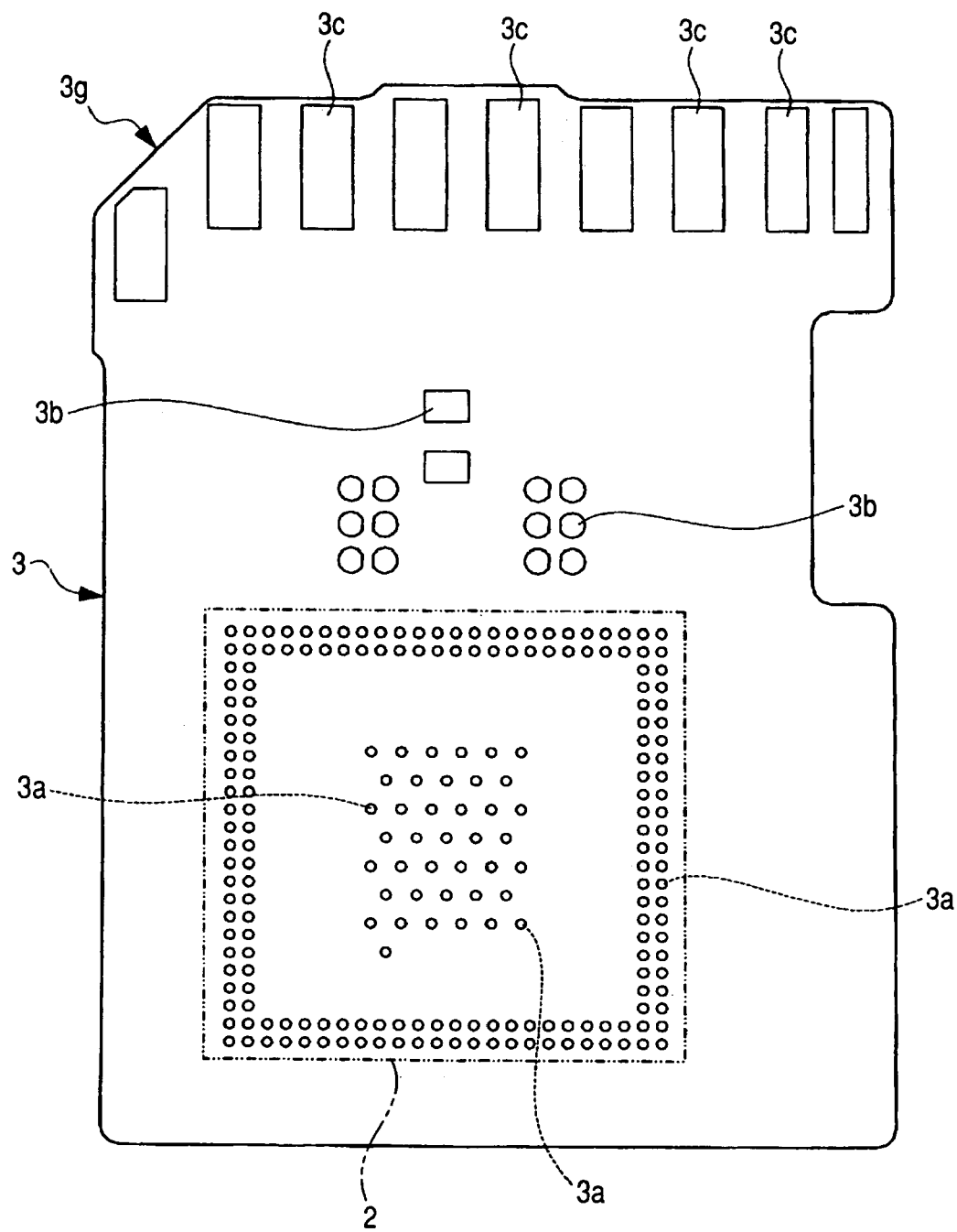
FIG. 40 is a back view showing an example of the component mounting layout of the back surface side of the substrate in the semiconductor device shown in FIG. 39.
Figure 41:
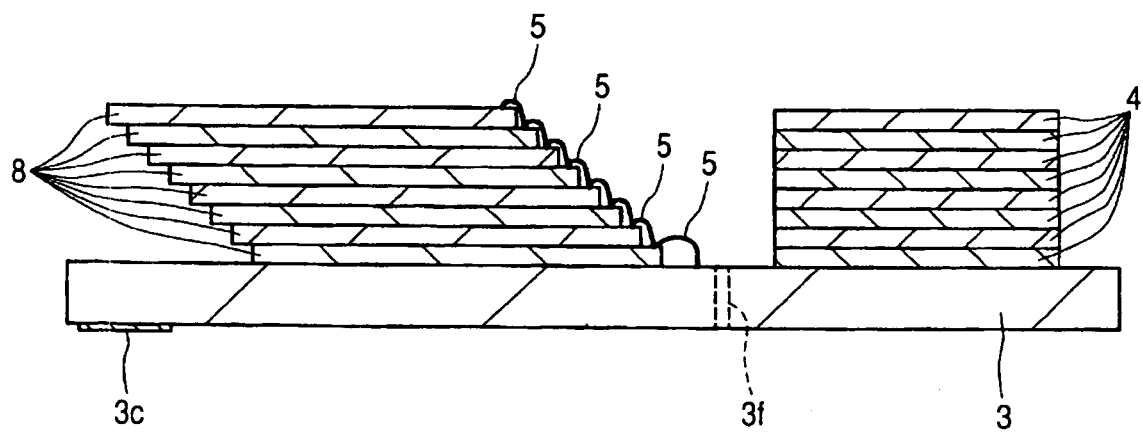
FIG. 41 is a cross-sectional view showing the structure of the cross section cut along the A-A line of FIG. 39.
Figure 42:
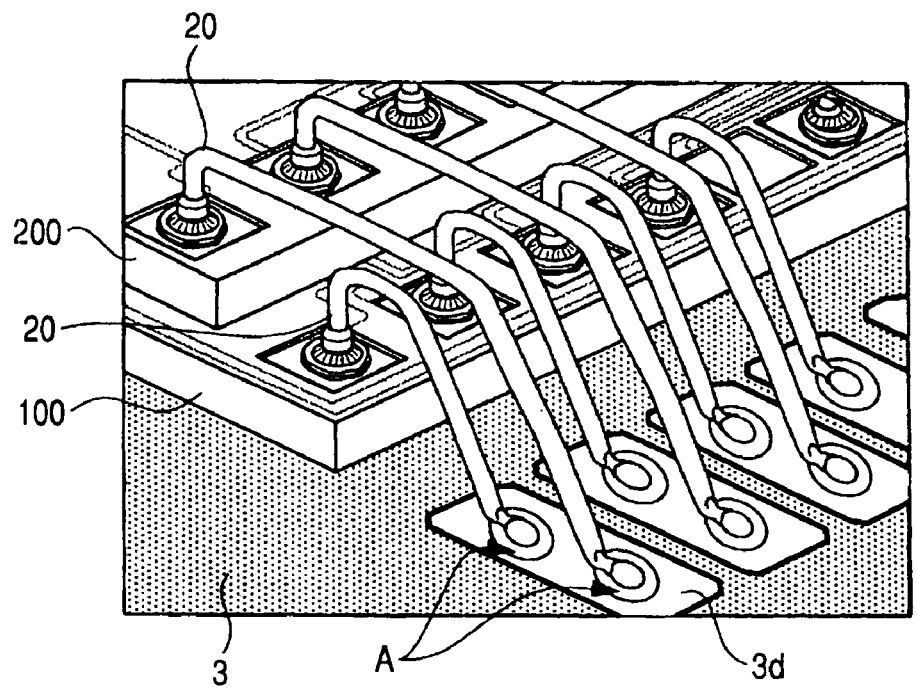
FIGS. 42 to 46 are fragmentary perspective views showing the wire bonding method of a comparative example.
Figure 43:
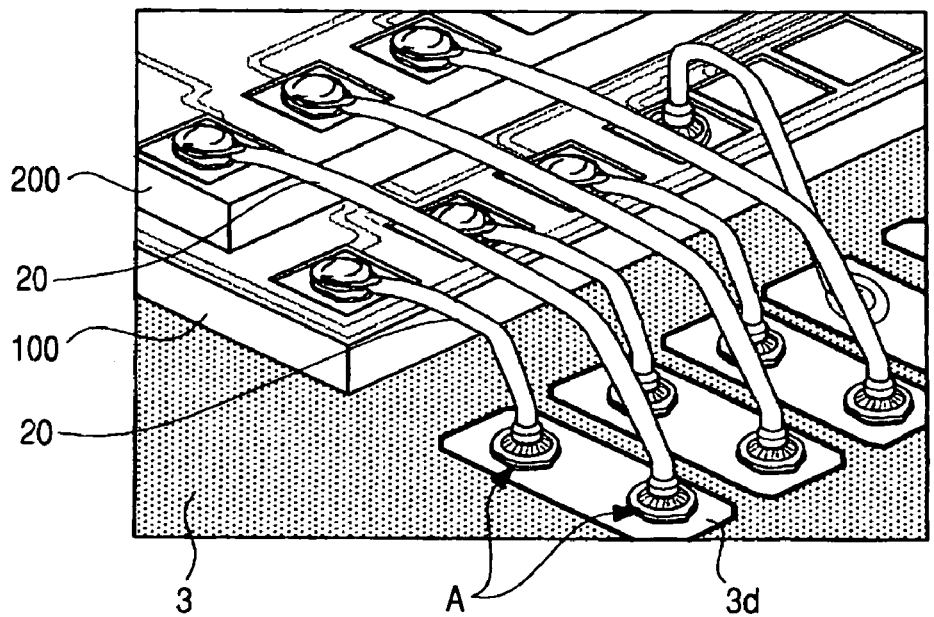
Figure 44:
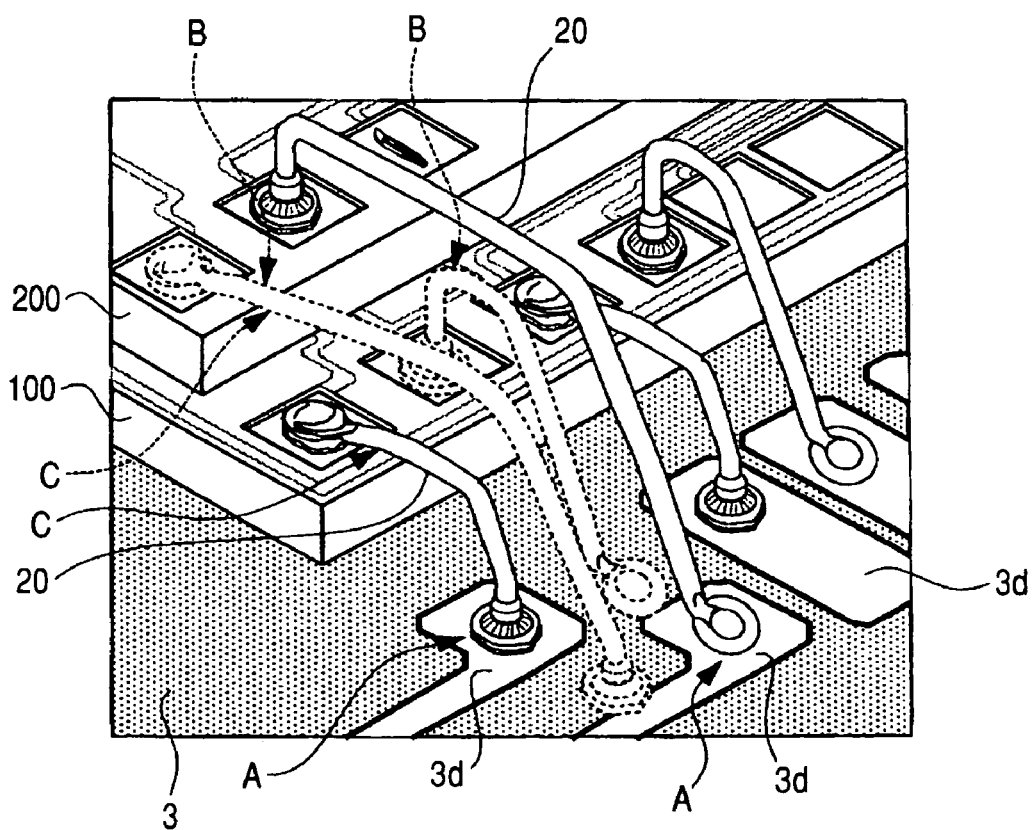
Figure 45:
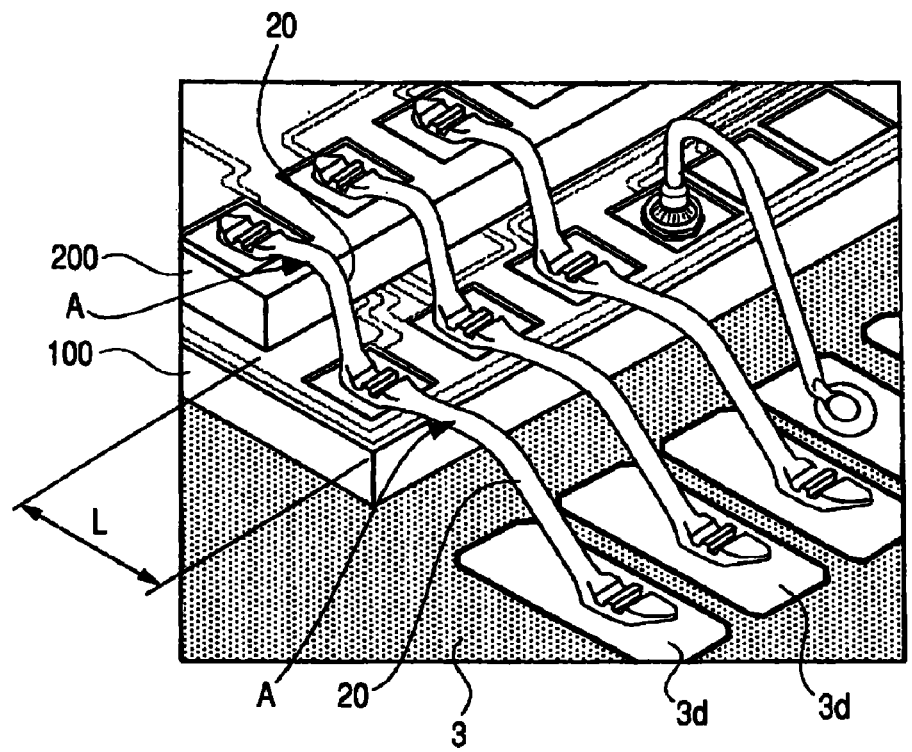
Figure 46:
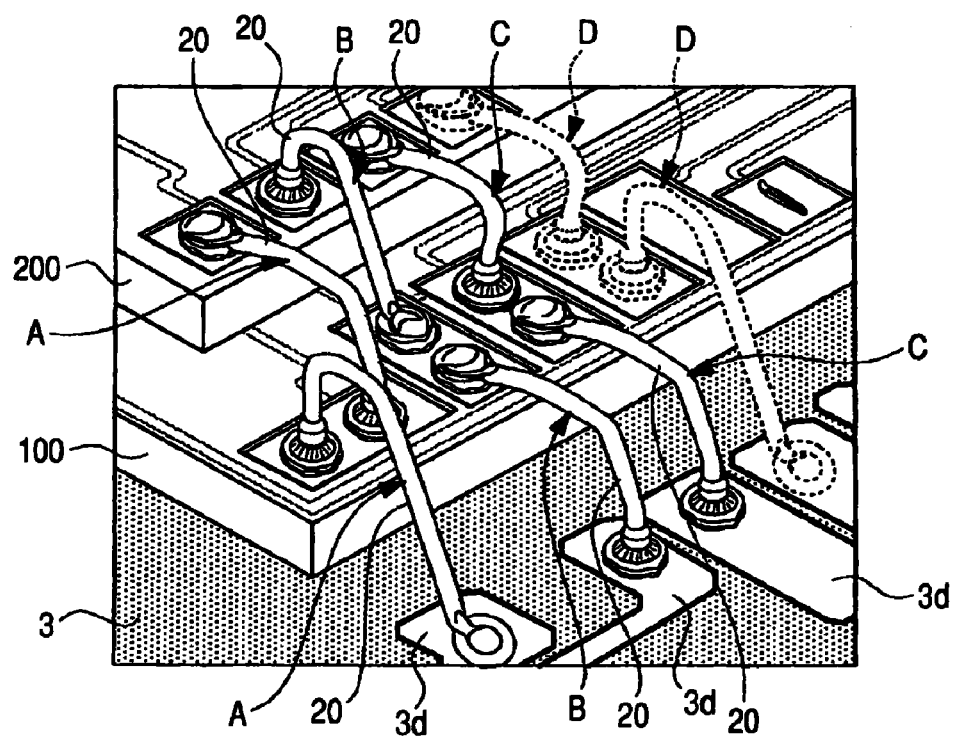
Figure 47:
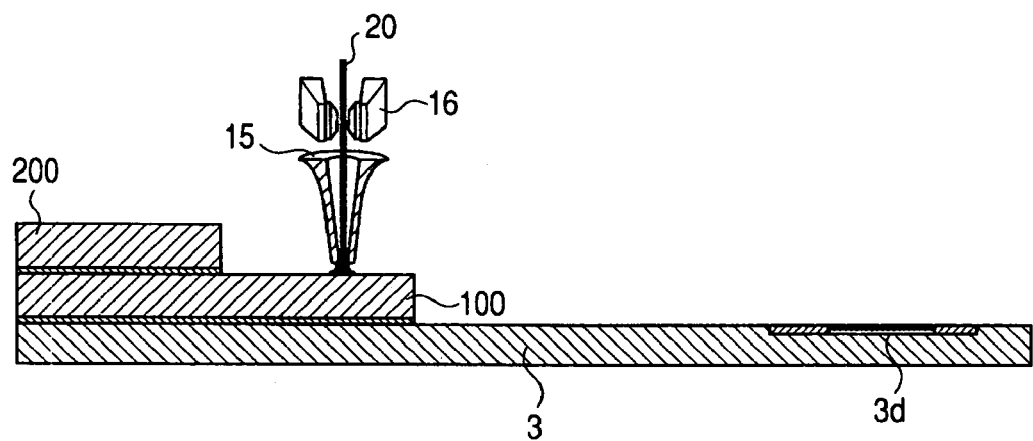
FIGS. 47 to 51 are side views showing the forward bonding procedure in the wire bonding of a comparative example.
Figure 48:
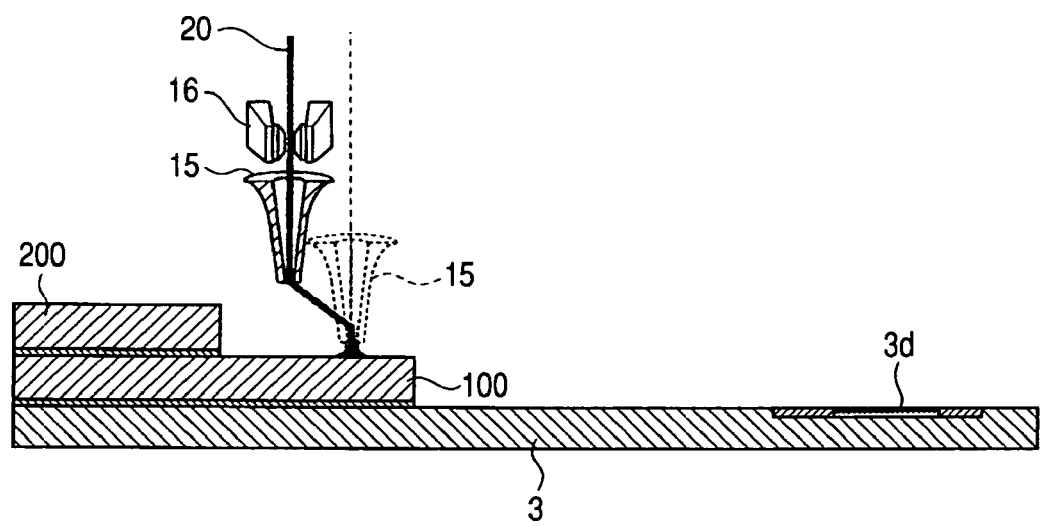
Figure 49:
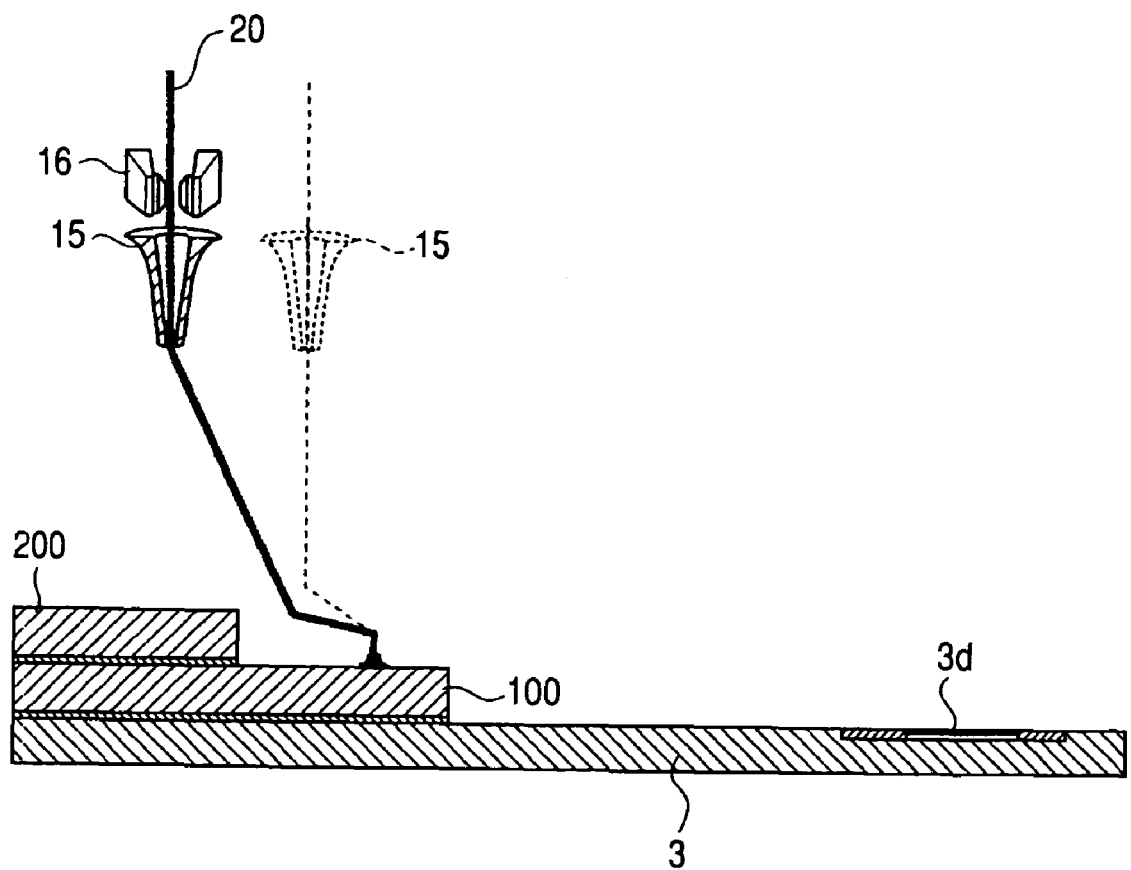
Figure 50:
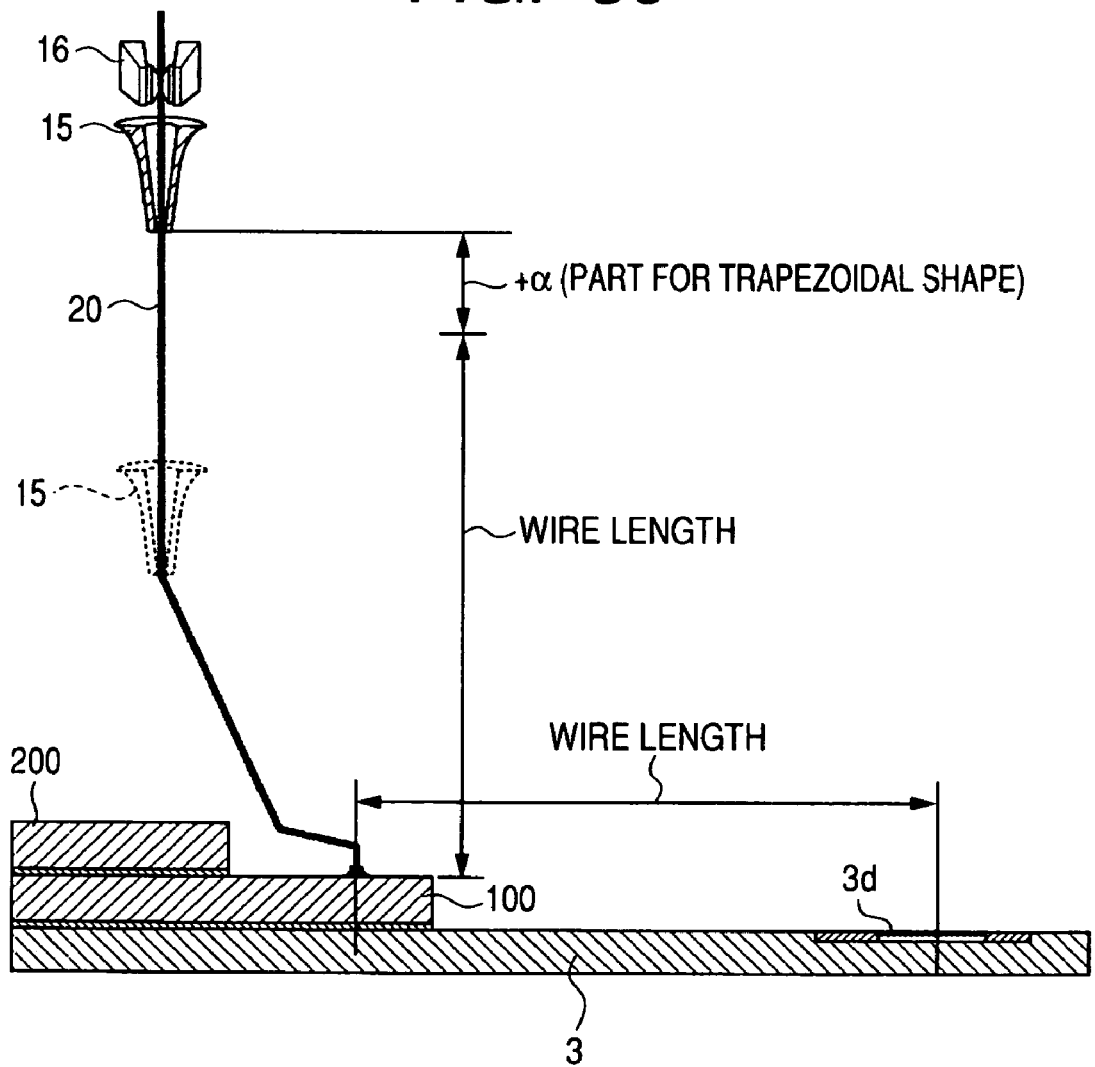
Figure 51:
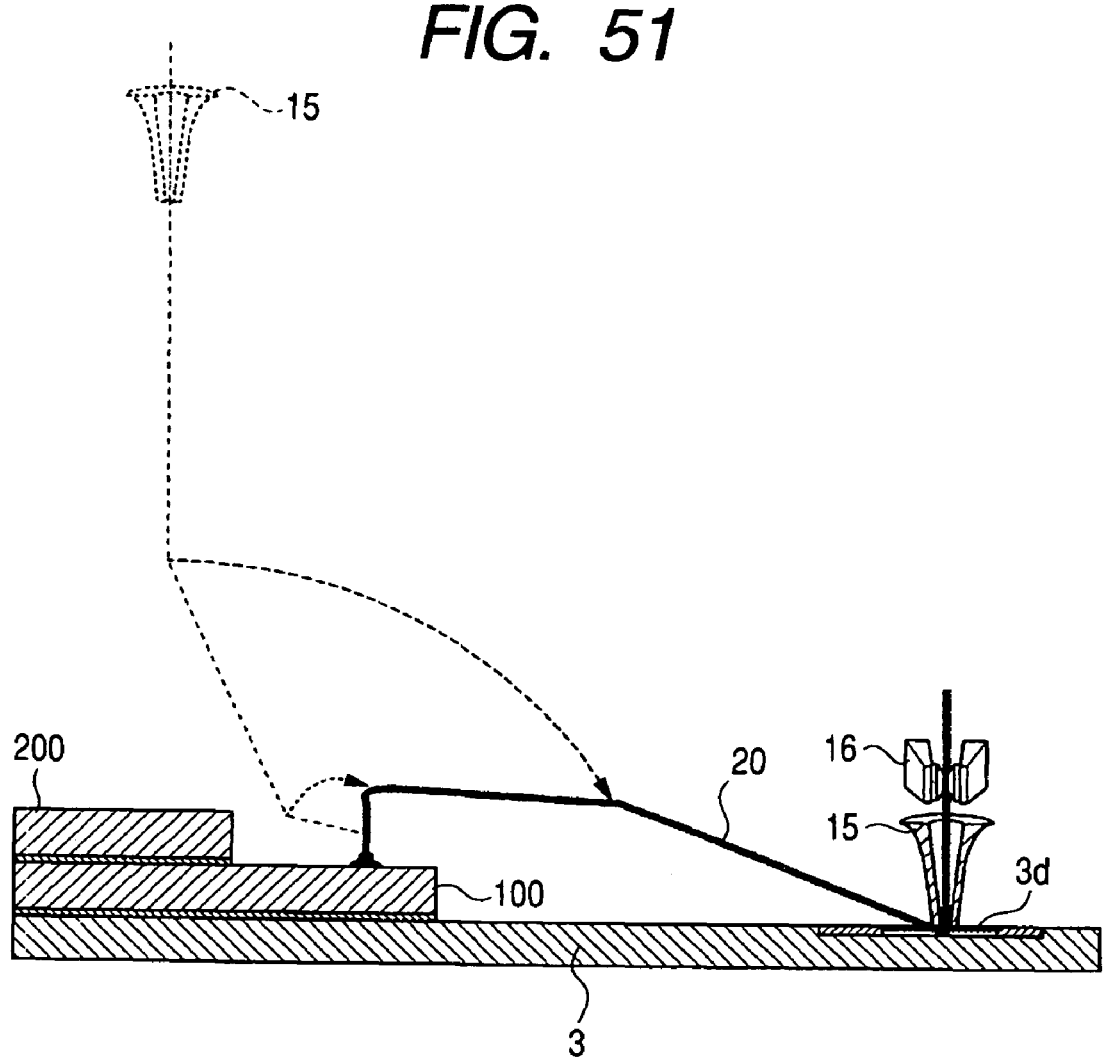

FIG. 39 is a plan view showing an example of the component mounting layout of the front surface side of the substrate in the semiconductor device of Embodiment 2 of the present invention, FIG. 40 is a back view showing an example of the component mounting layout of the back surface side of the substrate in the semiconductor device shown in FIG. 39, and FIG. 41 is a cross-sectional view showing the structure of the cross section cut along the A-A line of FIG. 39.

Embodiment 2 explains mounting structures, such as an internal chip layout, in memory cards 7, such as an SD card, explained by Embodiment 1.

When explaining the mounting structure inside of memory card 7, a plurality of semiconductor chips are mounted on the front surface (main surface) of substrate 3, as shown in FIG. 39. On the back surface of substrate 3, as shown in FIG. 40, while controller chip 2 which was electrically connected to land 3a via ball electrode 6 (refer to FIG. 5) and which is a chip for control, and a plurality of components 3b are mounted, a plurality of external terminals 3c are located in a line; and are arranged.

Two interface chips 9, and memory chips 4 and memory chips 8 which were laminated to eight stages, respectively are mounted on the front surface of substrate 3. Two interface chips 9, and memory chips 4 and memory chips 8 laminated to eight stages are electrically connected with substrate 3 by wires 5 (for example, gold wire etc.), respectively.

Memory chip 4 laminated to eight stages as shown in FIG. 41 is a chip of the same kind which equipped each with the memory circuit, and is a chip of the same size altogether eight stages. Each main surface of eight stages of all memory chips 4 accomplishes a rectangle. The memory circuit is a nonvolatile memory circuit.

Similarly, memory chip 8 laminated to eight stages is also a chip of the same kind which equipped each with the memory circuit, and is a chip of the same size altogether eight stages. Each main surface of eight stages of all memory chips 8 accomplishes a rectangle, and the memory circuit is a nonvolatile memory circuit.

As for memory chip 4 and memory chip 8, on the front surface of substrate 3, one of them is mounted in the vertical direction, and the other of them is mounted in the horizontal direction, respectively. For example, in the example shown in FIG. 39, when making a direction parallel to the long-side direction (the direction of a card plug) of substrate 3 into a vertical direction, and making into the horizontal direction the direction which constitutes right angle with this vertical direction, memory chip 4 is mounted in the horizontal direction, and memory chip 8 is mounted in the vertical direction.

Controller chip 2 which is a chip for control controls transmission and reception of the signal of memory chip 4 and memory chip 8, and the outside, and interface chip 9 controls transmission and reception of the signal of memory chip 4 and memory chip 8, and controller chip 2.

Therefore, memory chip 4 is connected to controller chip 2, being controlled by interface chip 9 mounted in the neighborhood, and further, memory chip 8 is connected to controller chip 2, being controlled by the other interface chip 9.

Notch section 3g is formed in substrate 3 at any one of the corner parts. This notch section 3g shows the direction of memory card 7. Therefore, as for the length of the longitudinal direction of the both side parts of memory card 7, as shown in FIG. 39, it is Y1>Y2 and the length of the side part differs.

Therefore, the mounting efficiency is good in the case that the chip of comparatively small size is mounted in Y2 side, and interface chip 9 of comparatively small size is arranged, respectively. Since memory chip 8 is larger than interface chip 9, it is arranged at Y1 side.

That is, two interface chips are arranged between memory chip 8 laminated to eight stages, and the end portion of substrate 3 (side part at the side of Y2) connected with notch section 3g.

Among memory chip 4 and memory chip 8, in memory chip 4 arranged near gate part 3h for resin moldings, a plurality of wires 5 connected to this memory chip 4 are arranged in the opposite side to gate part 3h. It is more desirable not to arrange wires 5 near gate part 3h for resin moldings in consideration of the fluidity of resin (resin 14 for sealing shown in FIGS. 30A, 30B, and 30C).

That is, as for a plurality of wires 5 connected to the chip laminated to eight stages like memory chips 4 and 8 of Embodiment 2, since loop height control, loop shape, etc. are complicated, it is preferred to arrange in the part which does not accept the resin transfer pressure at the time of a resin molding easily.

Thus, in memory chip 4 arranged near gate part 3h, the wire deformation by resin at the time of a resin molding can be reduced by arranging a plurality of wires 5 to the opposite side of gate part 3h.

In memory chip 8 arranged near a plurality of external terminals 3c among memory chip 4 or memory chip 8, a plurality of through holes 3f which electrically connect this memory chip 8 and external terminal 3c and which are shown in FIG. 41 are formed in the opposite side of external terminal 3c.

Namely, since memory card 7 of Embodiment 2 is the high-density-assembly structure where the chip was laminated to eight stages, by arranging a plurality of through holes 3f which electrically connect memory chip 8 and external terminal 3c to the opposite side of external terminal 3c, as shown in FIG. 41, high density assembly can be realized, overlapping the mounting position of memory chip 8 laminated to eight stages and external terminal 3c on the back and the front surfaces.

In the foregoing, the present invention accomplished by the present inventors is concretely explained based on above embodiments, but the present invention is not limited by the above embodiments, but variations and modifications may be made, of course, in various ways in the limit that does not deviate from the gist of the invention.

For example, although the Embodiment 1 and 2 explained the case where memory chips 4 and 8 were laminated to eight stages, respectively, as long as the number of laminations of memory chip 4 and 8 is plurality, it may be any stages.

The size of memory chips 4 and 8 laminated may not necessarily be altogether the same, and may not be a rectangle altogether further.

Although the semiconductor device is a memory card, and the SD card was taken up and explained as an example in the Embodiment 1 and 2, the semiconductor device may not be limited to an SD card, and may be an other card shape semiconductor device.

The present invention is suitable for a semiconductor device and a semiconductor manufacturing technology of a chip lamination type.

What is claimed is:

1. A method of manufacturing a semiconductor device, comprising the steps of:
    (a) providing a first component having a first main surface, a first electrode formed on the first main surface, and a first back surface opposing the first main surface;
    (b) mounting a second component over the first component such that a second back surface of the second component faces the first main surface of the first component, and such that the first electrode is spaced from the second component in a plan view, the second component having a second main surface opposing the second back surface and a second electrode formed on the second main surface;
    (c) mounting a third component over the second component such that a third back surface of the third component faces the second main surface of the second component, and such that the second electrode is spaced from the third component in the plan view, the third component having a third main surface opposing the third back surface and a third electrode formed on the third main surface;
    (d) forming a first bump on the second electrode of the second component;
    (e) electrically connecting the first electrode of the first component and the first bump on the second electrode of the second component via a first wire; and
    (f) electrically connecting the first bump on the second electrode of the second component and the third electrode of the third component with a second wire,
    wherein step (e) includes:
    (e1) connecting a first part of the first wire and the first electrode of the first component by using a capillary, the first wire leading out of the capillary through a through hole of the capillary;
    (e2) after step (e1), moving the capillary in a reverse operation from the first electrode away from the second component to a first position, the third component being mounted over the second component such that a horizontal distance from the first bump to an edge of the third component closest to the second electrode is less than a horizontal movement distance of the reverse operation from the first electrode to the first position;
    (e3) after step (e2), moving the capillary from the first position to the first bump on the second electrode of the second component; and
    (e4) after step (e3), electrically connecting a second part of the first wire with the first bump on the second electrode of the second component,
    wherein, in said plan view, the first bump on the second electrode has a central axis perpendicular to a longitudinal direction of the second part of the first wire, and wherein step (f) includes:
(f1) connecting a first part of the second wire and the first bump on the second electrode of the second component by using a capillary such that, in said plan view, a tip of the first part of the second wire extends across said axis of the first bump and does not extend outside a perimeter of the second electrode.

2. A method of manufacturing a semiconductor device according to claim 1, wherein the first component, the second component, and the third component are semiconductor chips.

3. A method of manufacturing a semiconductor device according to claim 2, wherein the semiconductor chips are nonvolatile memory chips.

4. A method of manufacturing a semiconductor device according to claim 2, wherein the semiconductor chips are the same size.

5. A method of manufacturing a semiconductor device according to claim 1, wherein the semiconductor device has a memory card shape.

6. A method of manufacturing a semiconductor device according to claim 1, wherein the tip of the first part of the second wire overlaps with a portion of the second part of the first wire.

7. A method of manufacturing a semiconductor device according to claim 1, wherein the first component is a substrate, and the second and third components are semiconductor chips.

8. A method of manufacturing a semiconductor device according to claim 7, wherein the semiconductor chips are nonvolatile memory chips.

9. A method of manufacturing a semiconductor device according to claim 7, wherein the semiconductor chips are the same size.

10. A method of manufacturing a semiconductor device according to claim 1, further comprising, before step (f), forming a second bump on the third electrode of the third component.

11. A method of manufacturing a semiconductor device according to claim 10, wherein step (f) includes (f2) connecting a second part of the second wire and the second bump on the third electrode of the third component.

12. A method of manufacturing a semiconductor device according to claim 1, wherein a top surface of the second electrode is exposed via an aperture.

13. A method of manufacturing a semiconductor device according to claim 12, wherein a step is formed around the second electrode such that the top surface of the second electrode is recessed.

14. A method of manufacturing a semiconductor device according to claim 1, wherein in step (e2), the capillary is moved away from both the second and third components to the first position.

15. A method of manufacturing a semiconductor device, comprising the steps of:
(a) providing a first component having a first main surface, a first electrode formed on the first main surface, and a first back surface opposing the first main surface;
(b) mounting a second component over the first component such that a second back surface of the second component faces the first main surface of the first component, and such that the first electrode is spaced from the second component in a plan view, the second component having a second main surface opposing the second back surface and a second electrode formed on the second main surface;
(c) mounting a third component over the second component such that a third back surface of the third component faces the second main surface of the second component, and such that the second electrode is spaced from the third component in the plan view, the third component having a third main surface opposing the third back surface and a third electrode formed on the third main surface;
(d) forming a first bump on the second electrode of the second component; and
(e) electrically connecting the first electrode of the first component and the first bump on the second electrode of the second component via a first wire,
wherein step (e) includes:
(e1) connecting a first part of the first wire and the first electrode of the first component by using a capillary, the first wire leading out of the capillary through a through hole of the capillary;
(e2) after step (e1), moving the capillary in a reverse operation from the first electrode away from the second component to a first position, the third component being mounted over the second component such that a horizontal distance from the first bump to an edge of the third component closest to the second electrode is less than a horizontal movement distance of the reverse operation from the first electrode to the first position;
(e3) after step (e2), moving the capillary from the first position to the first bump on the second electrode of the second component; and
(e4) after step (e3), electrically connecting a second part of the first wire with the first bump on the second electrode of the second component.

16. A method of manufacturing a semiconductor device according to claim 15, wherein in step (e2), the capillary is moved away from both the second and third components to the first position.

17. A method of manufacturing a semiconductor device according to claim 15, comprising the step of:
(f) electrically connecting the first bump on the second electrode of the second component and the third electrode of the third component with a second wire.

18. A method of manufacturing a semiconductor device, comprising the steps of:
(a) providing a first component having a first main surface, a first electrode formed on the first main surface, and a first back surface opposing the first main surface;
(b) mounting a second component over the first component such that a second back surface of the second component faces the first main surface of the first component, and such that the first electrode is spaced from the second component in a plan view, the second component having a second main surface opposing the second back surface and a second electrode formed on the second main surface;
(c) mounting a third component over the second component such that a third back surface of the third component faces the second main surface of the second component, and such that the second electrode is spaced from the third component in the plan view, the third component having a third main surface opposing the third back surface and a third electrode formed on the third main surface;
(d) electrically connecting the first electrode of the first component and the second electrode of the second component via a first wire, wherein step (d) includes:

(d1) connecting a first part of the first wire and the first electrode of the first component by using a capillary, the first wire leading out of the capillary through a through hole of the capillary;

(d2) after step (d1), moving the capillary in a reverse operation from the first electrode away from the second component to a first position, the third component being mounted over the second component such that a horizontal distance from the second electrode to an edge of the third component closest to the second electrode is less than a horizontal movement distance of the reverse operation from the first electrode to the first position;

(d3) after step (d2), moving the capillary from the first position to the second electrode of the second component; and (d4) after step (d3), electrically connecting a second part of the first wire with the second electrode of the second component.

19. A method for manufacturing a semiconductor device according to claim 18, further comprising, before step (d), forming a first bump on the second electrode of the second component, wherein the electrically connecting the second part of the first wire with the second electrode is by way of the first bump.

* * * * *